(12) United States Patent
North et al.

(10) Patent No.: US 12,204,387 B2
(45) Date of Patent: Jan. 21, 2025

(54) METHOD AND APPARATUS FOR A MOBILE INFORMATION HANDLING SYSTEM WITH AN ION DRAG ENHANCED CONVECTION AIRFLOW

(71) Applicant: Dell Products, LP, Round Rock, TX (US)

(72) Inventors: Travis C. North, Cedar Park, TX (US); Qinghong He, Austin, TX (US); Enoch Chen, Wenshan District (TW)

(73) Assignee: DELL PRODUCTS LP, Round Rock, TX (US)

( * ) Notice: Subject to any disclaimer, the term of this patent is extended or adjusted under 35 U.S.C. 154(b) by 206 days.

(21) Appl. No.: 17/972,947

(22) Filed: Oct. 25, 2022

(65) Prior Publication Data

US 2024/0134428 A1 Apr. 25, 2024
US 2024/0231449 A9 Jul. 11, 2024

(51) Int. Cl.
*G06F 1/20* (2006.01)
*H01T 23/00* (2006.01)
*H05K 7/20* (2006.01)

(52) U.S. Cl.
CPC ............. *G06F 1/203* (2013.01); *H01T 23/00* (2013.01); *H05K 7/20136* (2013.01); *H05K 7/20409* (2013.01)

(58) Field of Classification Search
CPC ........... H05K 7/20172; H05K 7/20145; H05K 7/20409; H05K 7/20136; H01T 23/00;
(Continued)

(56) References Cited

U.S. PATENT DOCUMENTS 7,545,640 B2 6/2009 Fisher
8,508,908 B2 * 8/2013 Jewell-Larsen .... H05K 7/20172
361/231
(Continued)

FOREIGN PATENT DOCUMENTS

WO 2007/112763 A1 10/2007
WO 2009/131980 A2 10/2009
(Continued)

*Primary Examiner* — Michael A Matey
(74) *Attorney, Agent, or Firm* — Prol Intellectual Property Law, PLLC; H. Kenneth Prol

(57) ABSTRACT

An information handling system (IHS) includes an ion emitter/collector blower cooling system including an ion emitter and an ion collector, the ion emitter/collector blower system being placed at a location within a chassis of the IHS vertically lower than the hardware processor in the chassis. The IHS includes an ionic driving circuit operatively coupled to the ion emitter via a high voltage to ionize gases within the ion emitter/collector blower housing and create charged ions that generate an airflow along a voltage field to and through an ion collector. The IHS includes an air inlet vent located below the ion emitter/collector and formed in a back surface of the chassis of the IHS and an air exhaust vent located at an upper exhaust vent location above the ion collector within the chassis of the IHS so that the airflow is brought into the chassis of the IHS via the ion emitter/collector cooling system and out of the air exhaust vent where a location of the air inlet vent relative to the upper exhaust vent location of the air exhaust vent in the chassis of the IHS in a vertical orientation provides convection-enhanced airflow.

20 Claims, 8 Drawing Sheets

(58) Field of Classification Search
CPC .. F28F 13/16; G06F 1/20; G06F 1/203; G06F 1/206; F24F 8/30; F28D 2021/0029
See application file for complete search history.

(56) References Cited

U.S. PATENT DOCUMENTS

| | | | |
|---|---|---|---|
| 2002/0155041 A1* | 10/2002 | McKinney, Jr. | B03C 3/12 422/186.04 |
| 2003/0206837 A1* | 11/2003 | Taylor | B01D 53/32 422/186 |
| 2005/0210902 A1* | 9/2005 | Parker | F24F 8/192 62/230 |
| 2005/0214180 A1 | 9/2005 | Joannou | |
| 2008/0197779 A1* | 8/2008 | Fisher | F28F 13/16 257/E23.099 |
| 2010/0037886 A1 | 2/2010 | Krichtafovitch | |
| 2010/0051709 A1 | 3/2010 | Krichtafovitch | |
| 2011/0036552 A1* | 2/2011 | Lu | G06F 1/20 165/185 |
| 2011/0261499 A1* | 10/2011 | Hizer | H01T 23/00 361/231 |
| 2011/0292593 A1* | 12/2011 | June | G06F 1/206 361/679.48 |
| 2012/0007742 A1 | 1/2012 | Gooch | |
| 2012/0008248 A1 | 1/2012 | Sawyer | |
| 2012/0057356 A1 | 3/2012 | Hizer | |
| 2013/0021715 A1 | 1/2013 | Jewell-Larsen | |
| 2013/0153199 A1* | 6/2013 | Busch | F28F 27/00 165/287 |
| 2016/0265856 A1 | 9/2016 | Saveliev | |
| 2024/0126351 A1* | 4/2024 | He | G06F 1/203 |

FOREIGN PATENT DOCUMENTS

| | | |
|---|---|---|
| WO | 2011/149667 A1 | 12/2011 |
| WO | 2012/006361 A2 | 1/2012 |

* cited by examiner

US 12,204,387 B2

METHOD AND APPARATUS FOR A MOBILE INFORMATION HANDLING SYSTEM WITH AN ION DRAG ENHANCED CONVECTION AIRFLOW

FIELD OF THE DISCLOSURE

The present disclosure generally relates to cooling systems for information handling system. The present disclosure more specifically relates to an ion emitter/collector blower cooling system used to cool an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. Under various operating conditions, especially high-performance conditions, information handling systems may generate heat which, if not mitigated, may affect performance. The information handling system may thus include a cooling system used to cool hardware therein such as a hardware processing device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
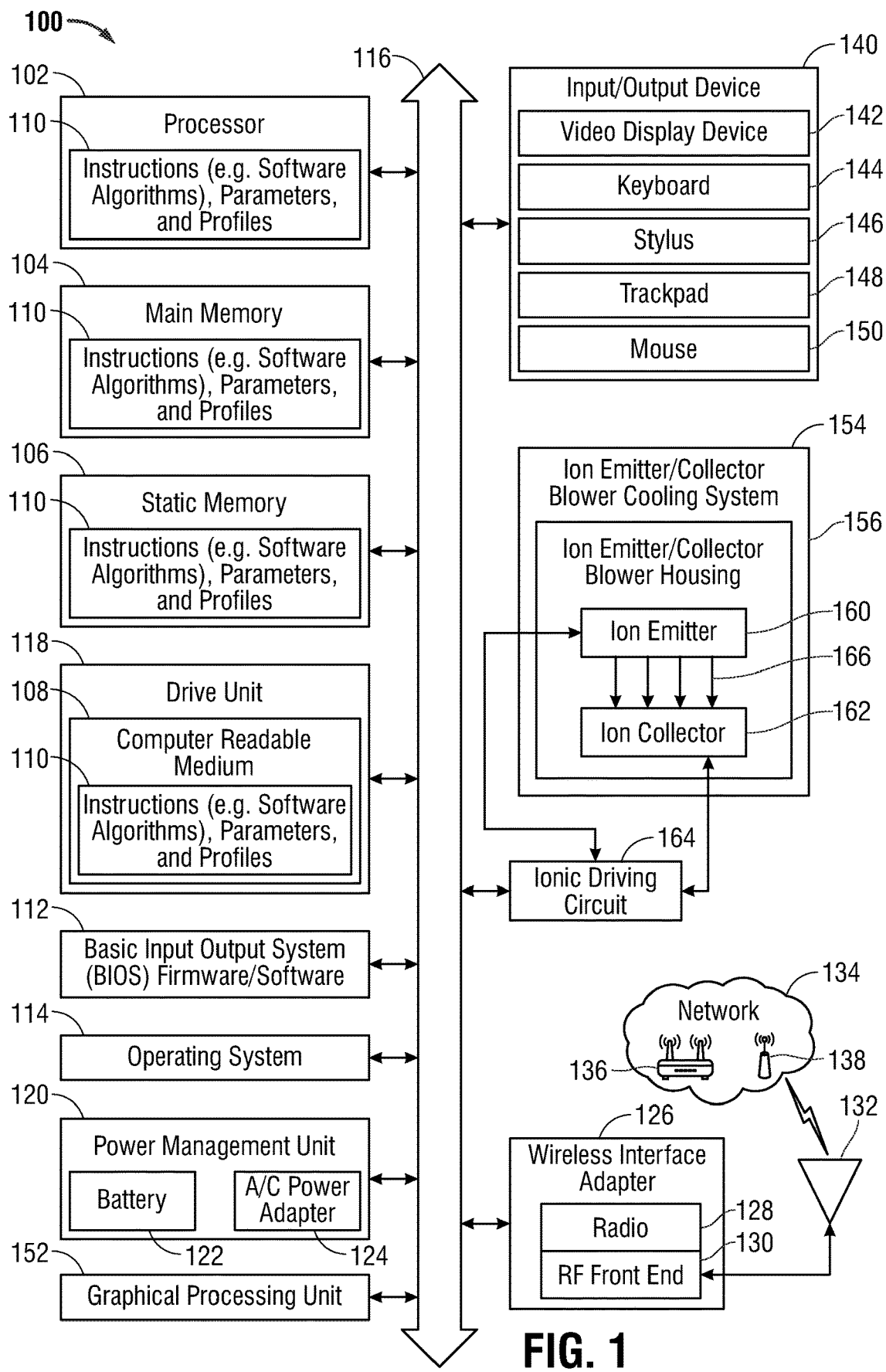
FIG. 1 is a block diagram of an information handling system including an ion emitter/collector blower cooling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Information handling systems operate to provide computing, data storage, and application resources among other computing resources. The hardware used to provide these resources to the user consume electricity. As a result of the consumption of this electricity, heat is produced within the housing or other structures used to house the hardware. Some information handling systems include a fan used to blow heat from within the housing to a vent to vent the heated air from within the housing. However, these fans may create a higher degree of noise that may interfere with the use of the information handling system especially when the fan speed is increased due to increased power consumption and a resulting increase in temperature within the housing.

The present specification describes an information handling system that includes processor, a memory device, and a power management unit (PMU) to provide power to the processor and memory device. The information handling system further includes an ion emitter/collector blower cooling system including an ion emitter housed within an ion emitter/collector blower housing, the ion emitter/collector blower cooling system being placed at a location with a housing of the information handling system vertically lower than the processor. This ion emitter/collector blower cooling system may include an ionic driving circuit operatively coupled to the ion emitter via a high voltage to ionize gases within the ion emitter/collector blower housing and create charged ions to create an airflow to and through an ion collector. An air inlet vent is located below the ion emitter/collector blower cooling system and formed in a back surface of the housing of the information handling system. An air exhaust vent is located above the ion collector so that air can be brought into the housing of the information handling system in a vertical, near-vertical, or otherwise upright orientation and out of the air exhaust vent at an upper exhaust vent location via operation of the ion emitter/collector blower cooling system.

In an embodiment, the ion collector is formed at the external opening of the ion emitter/collector blower housing to provide a deionization source for the ionized gases formed by the ion emitter, the ion collector including one or more separated blades through which the airflow may pass. The separated blades of the ion collector may operate as thermal fins to dissipate heat conducted from a passive heat conducting device. These blades, in an embodiment, may be operatively coupled to the separated blades so that heat form heat-generating hardware components within the housing of the information handling system may be conducted into the separated blades. As the airflow passes the separated blades, the heat may be passed out of the housing of the information handling system via convection.

In an embodiment, the ion emitter includes a plurality of blades operatively coupled to the ionic driving circuit with the ionic driving circuit including a high-voltage electrical source to strip electrons from gas molecules via the high voltage at edges of the blades of the ion emitter. The ionic driving circuit causes electrons to be stripped from gas molecules located at edges of the plurality of emitter blades to ionize gases within the ion emitter/collector blower housing and create charged ions (e.g., cations) to create an airflow within the ion emitter/collector blower housing and out from the ion emitter/collector blower housing. The ion collector may attract those ions thereby generating airflow by a shearing, dragging, or pulling force of the ions on surrounding air due to the electromagnetic attraction at the ion collector (e.g., ion collector is an anode of the ionic driving circuit). This movement of the created ions by the emitter blades of the ion emitter/collector blower cooling system produces a dragging or shearing force of the surrounding air to generate the airflow from the ion emitter to the ion collector in an embodiment. This reduces the noise created by the movement of the fan blades by, potentially, reducing the use of a fan or other type of blower to extract the heated air from within the housing of the information handling system.

FIG. 1 illustrates an information handling system 100 similar to information handling systems according to several aspects of the present disclosure that is operatively couplable to a cooling system formed within a housing of the information handling system. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a convertible laptop, a two-in-one computer, a tablet, a smartphone, a communications device, an access point (AP), a base station transceiver, a wireless telephone, a control system, a camera, a scanner, a printer, a personal trusted device, a web appliance, or any other suitable machine capable of executing a set of machine-readable code instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video, or data communication. For example, an information handling system 100 may be any mobile or other computing device capable of executing a set of machine-readable code instructions (sequential or otherwise) that specify actions to be taken by that machine. In an embodiment, the information handling system 100 may be operatively coupled to a server or other network device as well as with any wireless peripheral devices. Further, while a single information handling system 100 is illustrated, the term "system" shall also be taken to include any collection of systems or sub-systems that individually or jointly execute a set, or multiple sets, of machine-readable code instructions to perform one or more computer functions.

The information handling system 100 may include memory (volatile (e.g., random-access memory, etc.), non-volatile (read-only memory, flash memory etc.) or any combination thereof), one or more hardware processing resources, such as a central processing unit (CPU), a graphics processing unit (GPU) 152, hardware processing device, hardware controller, or any combination thereof. Additional components of the information handling system 100 can include one or more storage devices, one or more communications ports for communicating with external devices, as well as various input and output (110) devices 140, such as a keyboard 144, a mouse 150, a video display device 142, a stylus 146, a trackpad 148, or any combination thereof. The information handling system 100 can also include one or more buses 116 operable to transmit data communications between the various hardware components described herein. Portions of an information handling system 100 may themselves be considered information handling systems and some or all of which may be wireless.

Information handling system 100 can include devices or modules that embody one or more of the hardware devices or hardware processing resources to execute machine-readable code instructions for the one or more systems and modules described above, and operates to perform one or more of the methods described herein. For example, machine-readable code instructions may be executed by a PMU controller or other hardware processing resource for an ion emitter/collector blower cooling system 154 to control the ion emitter/collector blower cooling system 154 of embodiments herein. The information handling system 100 may execute machine-readable code instructions 110 via hardware processing resources that may operate on servers or systems, remote data centers, or on-box in individual client information handling systems according to various embodiments herein. In some embodiments, it is understood any or all portions of machine-readable code instructions 110 may operate on a plurality of information handling systems 100.

The information handling system 100 may include hardware processing resources such as a processor 102, a central processing unit (CPU), accelerated processing unit (APU), a neural processing unit (NPU), a vision processing unit (VPU), an embedded controller (EC), a digital signal processor (DSP), a GPU 152, a microcontroller, or any other type of hardware processing device that executes machine-readable code instructions to perform the processes described herein. Any of the hardware processing resources may operate to execute code that is either firmware or software code. Moreover, the information handling system 100 can include memory such as main memory 104, static memory 106, computer readable medium 108 storing machine-readable code instructions 110 of, in an example embodiment, an ion emitter/collector blower cooling system 154 (e.g., controlled by a power management unit (PMU) controller), or other computer executable program code, and drive unit 118 (volatile (e.g., random-access memory, etc.), nonvolatile (read-only memory, flash memory etc.) or any combination thereof).

As shown, the information handling system 100 may further include a video display device 142. The video display device 142, in an embodiment, may function as a liquid crystal display (LCD), an organic light emitting diode (OLED), a flat panel display, or a solid-state display. Although FIG. 1 shows a single video display device 142, the present specification contemplates that multiple video display devices 142 may be used with the information handling system to facilitate an extended desktop scenario, for example. Additionally, the information handling system 100 may include one or more input/output devices 140 including an alpha numeric input device such as a keyboard 144 and/or a cursor control device, such as a mouse 150, touchpad/trackpad 148, a stylus 146, or a gesture or touch screen input device associated with the video display device 142 that allow a user to interact with the images, windows, and applications presented to the user. In an embodiment, the video display device 142 may provide output to a user that includes, for example, one or more windows describing one or more instances of applications being executed by the hardware processor 102 of the information handling system. In this example embodiment, a window may be presented to the user that provides a graphical user interface (GUI) representing the execution of that application.

The network interface device of the information handling system 100 shown as wireless interface adapter 126 can provide connectivity among devices such as with Bluetooth® or to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 136 or base station 138 used to operatively couple the information handling system 100 to a network 134. In a specific embodiment, the network 134 may include macro-cellular connections via one or more base stations 138 or a wireless access point 136 (e.g., Wi-Fi), or such as through licensed or unlicensed WWAN small cell base stations 138. Connectivity may be via wired or wireless connection. For example, wireless network access points 136 or base stations 138 may be operatively connected to the information handling system 100. Wireless interface adapter 126 may include one or more radio frequency (RF) subsystems (e.g., radio 128) with transmitter/receiver circuitry, modem circuitry, one or more antenna front end circuits 130, one or more wireless controller circuits, amplifiers, antennas 132 and other circuitry of the radio 128 such as one or more antenna ports used for wireless communications via multiple radio access technologies (RATs). The radio 128 may communicate with one or more wireless technology protocols. In and embodiment, the radio 128 may contain individual subscriber identity module (SIM) profiles for each technology service provider and their available protocols for any operating subscriber-based radio access technologies such as cellular LTE communications.

In an example embodiment, the wireless interface adapter 126, radio 128, and antenna 132 may provide connectivity to one or more of the peripheral devices that may include a wireless video display device 142, a wireless keyboard 144, a wireless mouse 150, a wireless headset, a microphone, a wireless stylus 146, and a wireless trackpad 148, among other wireless peripheral devices used as input/output (I/O) devices 140.

The wireless interface adapter 126 may include any number of antennas 132 which may include any number of tunable antennas for use with the system and methods disclosed herein. Although FIG. 1 shows a single antenna 132, the present specification contemplates that the number of antennas 132 may include more or less of the number of individual antennas shown in FIG. 1. Additional antenna system modification circuitry (not shown) may also be included with the wireless interface adapter 126 to implement coexistence control measures via an antenna controller in various embodiments of the present disclosure.

In some aspects of the present disclosure, the wireless interface adapter 126 may operate two or more wireless links. In an embodiment, the wireless interface adapter 126 may operate a Bluetooth® wireless link using a Bluetooth® wireless or Bluetooth® Low Energy (BLE). In an embodiment, the Bluetooth® wireless protocol may operate at frequencies between 2.402 to 2.48 GHz.

The wireless interface adapter 126 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 126 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums.

The wireless interface adapter 126 can represent an add-in card, wireless network interface module that is integrated with a main board of the information handling system 100 or integrated with another wireless network interface capability, or any combination thereof. In an embodiment the wireless interface adapter 126 may include one or more radio frequency subsystems including transmitters and wireless controllers for connecting via a multitude of wireless links. In an example embodiment, an information handling system 100 may have an antenna system transmitter for Bluetooth®, BLE, 5G small cell WWAN, or Wi-Fi WLAN connectivity and one or more additional antenna system transmitters for macro-cellular communication. The RF subsystems and radios 128 and include wireless controllers to manage authentication, connectivity, communications, power levels for transmission, buffering, error correction, baseband processing, and other functions of the wireless interface adapter 126.

As described herein, the information handling system 100 may include and be operatively coupled to an ion emitter/collector blower cooling system 154. The ion emitter/collector blower cooling system 154 may be coupled within a housing of the information handling system 100 in an embodiment so that heat generated by the operation of the hardware (e.g., hardware processor 102, memory devices 104, 106, PMU 120, CPU, etc.) may be directed out of the housing of the information handling system 100 via an air exhaust vent formed in the housing (e.g., at a top side surface of the housing of the information handling system 100). The ion emitter/collector blower cooling system 154 may include an ion emitter/collector blower housing 156 used to house the components of the ion emitter/collector blower cooling system 154 described herein in an embodiment. In an alternative embodiment, the ion emitter/collector blower cooling system 154 does not include an ion emitter/collector blower housing 156 and instead, those components of the ion emitter/collector blower cooling system 154 are operatively coupled to the housing of the information handling system 100. For ease of discussion, the ion emitter/collector blower cooling system 154 will be described as including the ion emitter/collector blower housing 156 which allows the ion emitter/collector blower cooling system 154 to be modular and replaced if necessary.

The ion emitter/collector blower cooling system 154 includes an ion emitter 160. In an embodiment, the ion emitter 160 includes a plurality of emitter blades through which air may pass and which are used to create an airflow into, through, and out of the ion emitter/collector blower housing 156. The number of blades may vary depending on an anticipated level of heat generation by the hardware components within the information handling system 100, and the shape and design of the ion emitter/collector blower housing 156 or housing of the information handling system 100, among other factors. Each of the emitter blades are coupled to an electrode of a high voltage source of an ionic driving circuit 164. In an embodiment, each of the emitter blades includes a blade edge. In one embodiment, the blade edges may be made to come to a sharp point in order to facilitate the creation of more ions. In an embodiment, the ion emitter 160 and the emitter blades may be made of a refractory metal such as niobium, chromium, molybdenum, tantalum, tungsten, and rhenium among others. In an embodiment, the portions of the ion emitter/collector blower cooling system 154 and emitter blades may be electroplated with a refractory metal such as niobium, chromium, molybdenum, tantalum, tungsten, and rhenium among others with an interior layer of the ion emitter 160 and emitter blades being made of a conductive material such as iron. It is appreciated that the emitter blades may be made of any alloy of metal that includes alloys of those refractory metals described herein.

The ion emitter/collector blower cooling system 154 also includes an ion collector 162. In an embodiment, the ion collector 162 includes a plurality of collector blades through which air may pass and which are used to deionize those ions 166 created at the ion emitter 160 as described herein. The number of collector blades may vary depending on an anticipated level of heat generation by the hardware components within the information handling system 100, and the shape and design of the ion emitter/collector blower housing 156 or the housing of the information handling system 100, among other factors such as the creation of ions 166 at the ion emitter 160. Each of the collector blades are coupled to an electrode of a high voltage source of an ionic driving circuit 164 in an embodiment. In an embodiment, the collector blades are coupled to a grounding source used to prevent arcing between the ion emitter 160 and ion collector 162. In an embodiment, each of the collector blades includes a blade edge. It is appreciated that the ion collector blades may be made of any alloy of metal that includes alloys of those refractory metals described herein.

As described herein, the ion emitter 160 and its blades as well as the ion collector 162 and its blades are electrically coupled to a high voltage source (e.g., 2 kV to 10 kV voltage source difference between the ion emitter 160 and the ion collector 162). In an embodiment, the ionic driving circuit 164 may include a boost converter that provides, for the high voltage source of the ionic driving circuit 164, those voltages described herein to the ion emitter 160 and ion collector 162.

As described in embodiments herein, the ion emitter/collector blower cooling system 154 may be operatively coupled to an ionic driving circuit 164. In an embodiment, the ionic driving circuit 164 is controlled via the processor 102, the PMU 120 with a hardware controller, or both. The ionic driving circuit 164, in an embodiment, includes a high voltage source that is operatively coupled to the ion emitter/collector blower cooling system 154. In an embodiment, the high voltage source may include a boost converter that steps up voltage from its input (e.g., a battery 122 or A/C power adapter 124) to the output at the ion emitter 160 and/or ion collector 162 of the ion emitter/collector blower cooling system 154. The high voltage source of the ionic driving circuit 164 causes the ion emitter 160 to emit ions 166 from the blade edges of each emitter blade. In the context of the present specification, the term "emit", or "emitter" is meant to describe an action and device that, at its edges or other surfaces, creates ions 166 and, via an electromagnetic repulsion, repels those ions towards an attracting, oppositely charged source such as the ion collector 162 described herein. In an embodiment, the high voltage source of the ionic driving circuit 164 causes electrons to be ripped away from certain molecules such as gas molecules in the atmosphere thereby creating ions (e.g., positively-charged ions) at the edges or other surfaces of the emitter blades. This ionization process may include the removal of one or more electrons from the outer valence shells of the individual molecules within the gas such that they become positively charged (e.g., cations) in an embodiment. In an example where the interior of the ion emitter/collector blower housing 156 includes atmospheric air, any number of types of gas molecules may be subjected to this process. For example, where the gas includes oxygen (O), the ionization of oxygen may include the removal of a single electron or two electrons from the oxygen molecule. This may lead to a $O^+$ or $O^{2+}$ ion (e.g., cation) being created by the ion emitter/collector blower cooling system 154 and ionic driving circuit 164 in an embodiment. Other gas molecules or molecules within the atmosphere within the ion emitter/collector blower housing 156 may similarly be ionized such as nitrogen, carbon dioxide, argon, hydrogen, etc. to create other ions such as $N^{+1}$, $N^{+2}$, $N^{+3}$, $N^{+4}$, $N^{+5}$, $O_3$ (ozone), $H^{+1}$.

This ionization of the atmospheric gases within the ion emitter/collector blower housing 156 helps to cause an airflow within the ion emitter/collector blower housing 156 (e.g., into the ion emitter/collector blower housing 156 and out of the ion emitter/collector blower housing 156). In an embodiment, the movement of the ions from the ion emitter 160 to the ion collector 162 creates a shearing force on the air (e.g., ionized molecules drag non-ionized molecules) within the ion emitter/collector blower housing 156. This shearing force pulls the other air molecules in the direction of the magnetic pull of the ions created by the ion emitter 160 towards the ion collector 162 thereby creating this airflow. In an embodiment, the movement of the ions 166 created and emitted from the ion emitter 160 may be from the ion emitter 160 to the ion collector 162. In an example embodiment, the ion emitter 160 may be operatively coupled to a positive electrode of the high voltage source of the ionic driving circuit 164. As a result of generating the positively charged ions 166, the charged ion emitter 160 now repels those positively charged ions 166 causing the charged ions 166 to be repelled away from the ion emitter 160, following the electric field created between the ion emitter 160 and ion collector 162, and attracted to the ion collector 162.

In an embodiment, the ion collector 162 is operatively coupled to a negative or opposite electrode of the high voltage source of the ionic driving circuit 164. In an embodiment, the ion collector 162 is operatively coupled to a grounding source or high voltage negative source of the ionic driving circuit 164. Whether the ion collector 162 is coupled to a negative electrode of the high voltage source or to ground of the high voltage source, the voltage difference between the ion emitter 160 and ion collector 162 determines an electric field between the ion emitter 160 and the ion collector 162. The ions 166 created by the ion emitter 160 follow this electric field. In an embodiment where the ion collector 162 is operatively coupled to a negative electrode of the high voltage source and not ground, the ion collector 162 may be electrically insulated from the remaining portions of the ion emitter/collector blower cooling system 154 including the ion emitter/collector blower housing 156. In an embodiment, this electrical isolation may be accomplished by making the ion emitter/collector blower housing 156 out of an electrically non-conductive material such as plastic. In an embodiment, the electrical isolation may be accomplished by placing an insulative gasket (not shown) between the ion collector 162 and the ion emitter/collector blower housing 156 and the ion emitter 160. The electrical isolation of the ion collector 162 allows for the electrical field between the ion emitter 160 and ion collector 162 to be formed allowing for an electrical field path for the ions 166 to follow.

In an embodiment, the creation of the electric field between the ion emitter 160 and ion collector 162 causes the positively-charged ions 166 created by the ion emitter 160 to be attracted to the negatively charged ion collector 162 further causing movement of the ions 166 and creating an airflow within the ion emitter/collector blower housing 156 as described. As the positively-charged ions 166 reach the ion collector 162, those missing valence electrons stripped away by the ion emitter 160 at the ions 166 may be added to a valence shell of the ionized molecules placing those gases at a neutral electrical charge again. Following the example of the ionization of the oxygen molecules in the atmospheric gases within the ion emitter/collector blower housing 156 by the ion emitter 160, as these $O^+$ or $O^{2+}$ ions 166 (e.g., cations) have their extraneous electrons returned from at their valence electron shells (e.g., a single electron or two electrons, respectively) the oxygen molecules are placed in an electrically neutral state.

The creation of this airflow via the ionic movement of the ions created by the ion emitter 160 has a low-pressure head of around 0.04 to 0.05 inches of $H_2O$ (water column) as compared to the rotation of a fan or another type of blower that may have a pressure head of around 0.5 inches of $H_2O$. However, the flow rate of air into and out of the ion emitter/collector blower cooling system 154 via operation of the ion emitter 160 and ion collector 162 creating ions 166 is relatively higher than the potential flow rate of air created by the rotation of a fan. For purposes of the present specification, the term "pressure head" is defined as the height of a fluid (e.g., air, water or other fluids) column that corresponds to a particular pressure exerted by the fluid column corresponding to pressure or psi of airflow created by the ionization of air. By imparting relatively high airflow rate with lower pressure head, the acoustics of the ion emitter/collector blower cooling system 154 are reduced in an embodiment.

In an embodiment, the airflow created by this movement of the ions 166 may supplement the airflow created via the rotation of a fan or activation of a blower. As such, in an embodiment, the rotation of the fan may be reduced in speed or stopped as compared to other fans that do not operate alongside an ion emitter/collector blower cooling system 154 in other information handling systems. Because the movement of the ions 166 creates an airflow, in some embodiments the rotation of the fan may be stopped allowing the cooling of the hardware within the housing of the information handling system 100 by the ion emitter/collector blower cooling system 154 to be accomplished via the airflow created by the creation of the ions 166 by the ion emitter 160. In some embodiments where the heat of the hardware within the housing of the information handling system 100 increases, the processor 102 may direct motor driver hardware to drive a fan motor to turn the fan so that the additional airflow created by the rotation of the fan blades may increase the speed of the airflow further. This allows the noises associated with the rotation of the fan to be reduced or even eliminated during relatively cool temperatures within the housing of the information handling system 100 thereby decreasing the noise heard by the user of the information handling system 100. As a result, in an embodiment, the ion emitter/collector blower cooling system 154 described herein may have a noiseless base capability of cooling the information handling system 100 with a backup cooling system via actuation of a fan motor to rotate the fan blades as described herein. This may further increase the user satisfaction of the information handling system 100 during operation of the information handling system 100 by decreasing fan noise heard by the user.

It is appreciated that a positive electrode of the high voltage source of the ionic driving circuit 164 may be operatively coupled to the ion emitter 160 with the negative electrode of the high voltage source operatively coupled to the ion collector 162. In this example embodiment, the ion collector 162 structure operating as the ion emitter 160 may strip electrons from the gas molecules creating a positively-charged ion 166 (e.g., cation) thereby operating, even temporarily, as the ion emitter 160. This allows the airflow created by the shearing force of the created ions 166 to be reversed. In an embodiment, this may be done so that any dust or debris collecting within the ion emitter/collector blower housing 156 or housing of the information handling system 100 may be dislodged. Because the ion emitter 160 is placed vertically above an air inlet vent, any dust or debris collected via this reversed airflow may be passed out of the housing of the information handling system 100 via this air inlet vent. The ionic driving circuit 164 may, therefor, selectively reverse the operatively connection of the electrodes to the ion emitter 160 and ion collector 162 to change the direction of airflow as described in order to perform this internal cleaning process.

In an embodiment, the information handling system 100 is a tablet-type information handling system or a two-in-one information handling system 100 with, in some examples, the keyboard 144 is a wireless or removeable keyboard that allows the user to use the information handling system 100 in either a tablet configuration or a laptop configuration. The information handling system 100 may be any information handling system that may be operated in an upright orientation. In an example embodiment, the hardware processor 102 such as a CPU may be placed within a display chassis instead of within the removable or wireless keyboard 144. This places the hardware processor 102 behind the video display device 142. The hardware processor 102, in an example embodiment, may be placed vertically at the same level or higher than the ion emitter/collector blower housing 156 with its ion emitter 160 and ion collector 162. The placement of the hardware processor 102 above the ion emitter/collector blower housing 156 allows for the operation of the ion emitter/collector blower cooling system 154 to take advantage of a stack effect or chimney effect. The stack effect, in the present specification, pulls air into the housing of the information handling system 100 via an air inlet vent and out of the housing via an air exhaust vent due to the differences in air buoyancy between the air inside the housing of the information handling system 100 and the air outside of the information handling system 100 for convection-assisted airflow. Because the air within the housing of the information handling system 100 is heated due to the operation of the heat-generating hardware components, cool air is pulled into the housing and accelerated through the housing via operation of the ion emitter/collector blower cooling system 154. This increases the amount of cold air drawn into and heated air passed out of the housing of the information handling system 100 via convection.

The information handling system 100 can include one or more set of machine-readable code instructions 110 that can be executed to cause the computer system to perform any one or more of the methods or computer-based functions disclosed herein. For example, machine-readable code instructions 110 may execute; via hardware processing resources, various software applications, software agents, a basic input/output system (BIOS) 112 firmware and/or software, or other aspects or components. Machine-readable code instructions 110 may execute a control system for an ion emitter/collector blower cooling system 154 to control various aspects of the ion emitter/collector blower cooling system 154 and ion emitter 160 with ion driving circuit 164 of the embodiments herein. Various software modules comprising application instructions 110 may be coordinated by an operating system (OS) 114, and/or via an application programming interface (API). An example OS 114 may include Windows®, Android®, and other OS types known in the art. Example APIs may include Win 32, Core Java API, or Android APIs.

The disk drive unit 118 and may include a computer-readable medium 108 in which one or more sets of machine-readable code instructions 110 such as software can be embedded to be executed by the processor 102 or other processing devices such as a GPU 152 to perform the processes described herein. Similarly, main memory 104 and static memory 106 may also contain a computer-readable medium for storage of one or more sets of machine-readable code instructions, parameters, or profiles 110 described herein. The disk drive unit 118 or static memory 106 also contain space for data storage. Further, the machine-readable code instructions 110 may embody one or more of the methods as described herein. In a particular embodiment, the machine-readable code instructions, parameters, and profiles 110 may reside completely, or at least partially, within the main memory 104, the static memory 106, and/or within the disk drive 118 during execution by the hardware processor 102 or GPU 152 of information handling system 100. The main memory 104, GPU 152, and the hardware processor 102 also may include computer-readable media.

Main memory 104 or other memory of the embodiments described herein may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The applications and associated APIs, for example, may be stored in static memory 106 or on the drive unit 118 that may include access to a computer-readable medium 108 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a processor or that cause a computer system to perform any one or more of the methods or operations disclosed herein.

In an embodiment, the information handling system 100 may further include a power management unit (PMU) 120 (a.k.a. a power supply unit (PSU)). The PMU 120 may include a hardware controller and executable machine-readable code instructions to manage the power provided to the components of the information handling system 100 such as the hardware processor 102, and manage control of the ion emitter/collector blower cooling system 154 including the ion emitter 160 and ion collector 162, ionic driving circuit 164, and other hardware components described herein. The PMU 120 may control power to one or more components including the one or more drive units 118, the hardware processor 102 (e.g., CPU), the GPU 152, a video/graphic display device 142 or other input/output devices 140 such as the stylus 146, a mouse 150, a keyboard 144, and a trackpad 148 and other components that may require power when a power button has been actuated by a user. In an embodiment, the PMU 120 may monitor power levels or temperature via thermistors and be electrically coupled, either wired or wirelessly, to the information handling system 100 to provide this power and coupled to bus 116 to provide or receive data or machine-readable code instructions. The PMU 120 may regulate power from a power source such as a battery 122 or A/C power adapter 124. In an embodiment, the battery 122 may be charged via the A/C power adapter 124 and provide power to the components of the information handling system 100 via a wired connections as applicable, or when A/C power from the A/C power adapter 124 is removed. PMU 120 may include a hardware controller to execute machine-readable code instructions 110 of an ion emitter/collector blower cooling system 154 to control the ion emitter 160 the ionic emitter/collector blower cooling system 154 based on detected temperature thresholds according to embodiments of the present disclosure.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses hardware resources executing software or firmware, as well as hardware implementations.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module can include hardware processing resources executing software, including firmware embedded at a device, such as an Intel® Core class processor, ARM® brand processors, Qualcomm® Snapdragon processors, or other processors and chipsets, or other such hardware device capable of operating a relevant software environment of the information handling system. The system, device, controller, or module can also include a combination of the foregoing examples of hardware or hardware executing software. Note that an information handling system can include an integrated circuit or a board-level product having portions thereof that can also be any combination of hardware and hardware executing software. Devices, modules, hardware resources, or hardware controllers that are in communication with one another need not be in continuous communication with each other, unless expressly specified otherwise. In addition, devices, modules, hardware resources, and controllers that are in communication with one another can communicate directly or indirectly through one or more intermediaries.

Figure 2A:
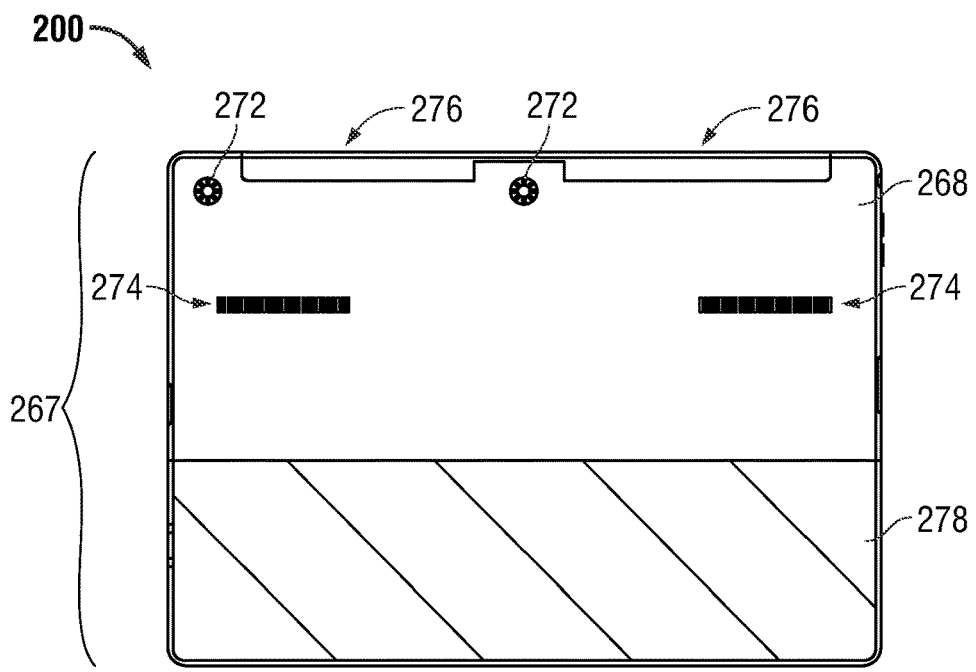
FIG. 2A is a graphic diagram rear view of an information handling system housing an ion emitter/collector blower cooling system according to an embodiment of the present disclosure.
Figure 2B:
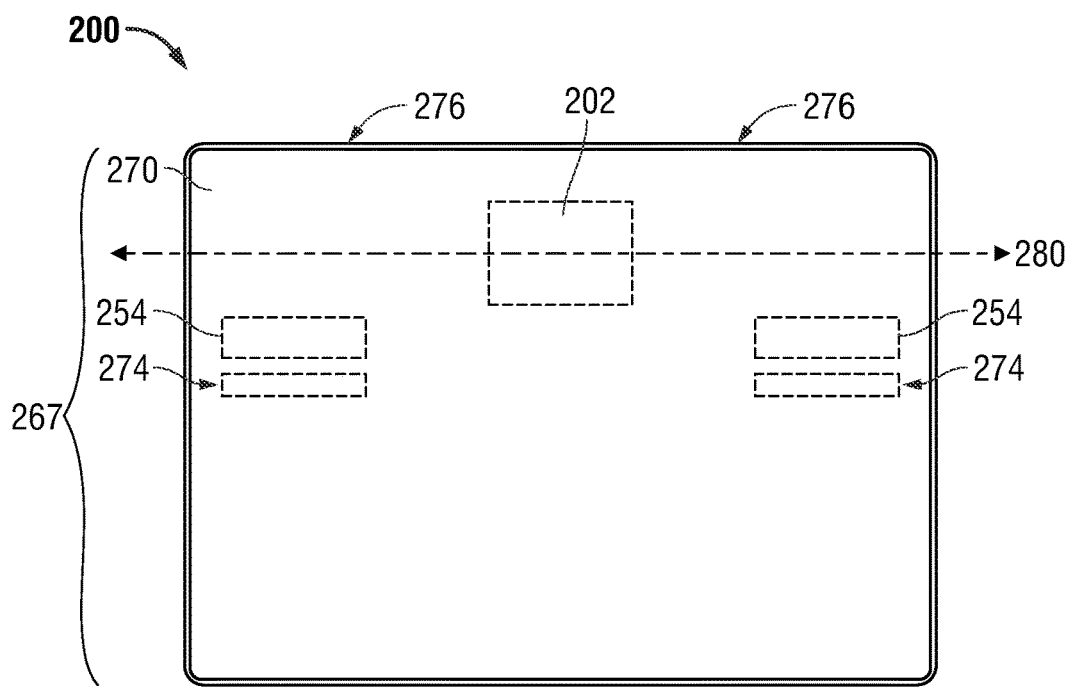
FIG. 2B is a graphic diagram front view of an information handling system housing an ion emitter/collector blower cooling system according to an embodiment of the present disclosure.

FIG. 2A is a graphic diagram rear view of a tablet-type or two-in-one information handling system 100 housing an ion emitter/collector blower cooling system according to an embodiment of the present disclosure. Additionally, FIG. 2B is a graphic diagram front view of a tablet-type or two-in-one information handling system housing an ion emitter/collector blower cooling system according to an embodiment of the present disclosure. The information handling system 200, as shown in FIGS. 2A and 2B may be one of a tablet information handling system or a two-in-one information handling system or other type of mobile information handling system that may operate in a vertical, near-vertical, or otherwise upright orientation in embodiments. As described herein, the information handling system 200 may include a wireless or detachable keyboard (not shown) used by the user to provide input to the information handling system 200. In an embodiment, the front cover/display 270 of the information handling system 200 may be a touch display device that also or alternatively allows the user to provide input to the information handling system 200.

As described herein, the information handling system 200 may include a display chassis 267 that includes the back cover 268 and front cover/display 270. The back cover 268 and front cover/display 270 may be used to house a processor at the processor location 202 as well as one or more ion emitter/collector blower cooling systems at an ion emitter/collector blower cooling system location 254. Other hardware components such as a battery (not shown), a memory device (not shown), a PMU (not shown) are also housed within the display chassis 267. The front cover/display 270, as described herein, includes a front cover/display 270 that serves both to cover this hardware as well as an input and output device via the touch screen video display device as described herein. The back cover 268 may also house a camera 272 or other imaging device used by a user to capture still images or videos.

As described herein, the ion emitter/collector blower cooling system may include one or more air inlet vents 274 formed vertically below the ion emitter/collector blower cooling system location 254. These air inlet vents 274 may allow air to be drawn into the display chassis 267 via activation of the ion emitter/collector blower cooling systems as well as a result of the air buoyancy differences between the cool air outside of the information handling system 200 and the relatively hotter air within the display chassis 267 for a convection-enhanced airflow. Air may be blown out of the display chassis 267 at one or more air exhaust vents 276 having an upper exhaust vent location in the vertically oriented information handling system 200 thereby cooling the air and heat-generating components (e.g., the hardware processor) within the display chassis 267.

As shown in FIGS. 2A and 2B, the ion emitter/collector blower cooling system locations 254 are at a vertical location below a CPU centerline 280. In the present specification and in the appended claims, the term "vertical" is meant as an upward location where the top of the information handling system 200 is where the air exhaust vents 276 are formed into the housing when the information handling system 200 is in a vertical, near-vertical, or otherwise upright orientation. Therefore, in FIGS. 2A and 2B, the CPU centerline 280 is closer, vertically, to the air exhaust vents 276 while the ion emitter/collector blower cooling system locations 254 are located at or below the CPU centerline 280. Still further, the air inlet vents 274 are placed, vertically, lower than the ion emitter/collector blower cooling system locations 254. The placement of the hardware processor at or above the ion emitter/collector blower cooling system allows for the operation of the ion emitter/collector blower cooling system to take advantage of a stack effect or chimney effect and remove air heated around the hardware processor. The stack effect, in the present specification, pulls air into the housing of the information handling system via the air inlet vents 274 and out of the housing via the air exhaust vents 276 due to the differences in air buoyancy between the air inside the housing of the information handling system 200 and the air outside of the information handling system 200. Because the air within the housing of the information handling system 200 is heated due to the operation of the heat-generating hardware components, cool air is pulled into the housing and accelerated through the housing via operation of the ion emitter/collector blower cooling system generating a convection-enhanced airflow. This increases the amount of cold air drawn into and heated air passed out of the housing of the information handling system 200 via convection.

As shown in FIG. 2A, the back cover 268 may include a kickstand 278 formed thereon. This kickstand 278 may allow the user to prop up the information handling system 200 on a flat surface or a lap in order to interact with the information handling system 200. The kickstand 278 can be moved to a closed orientation for the user to interact with the information handling system 200 as a tablet configuration, for example a hand-held tablet. Still further, in an embodiment where the kickstand 278 has been deployed, the user may operatively couple a detachable keyboard to the bottom edge of the information handling system 200 allowing the user to provide input to the information handling system 200.

Figure 3:
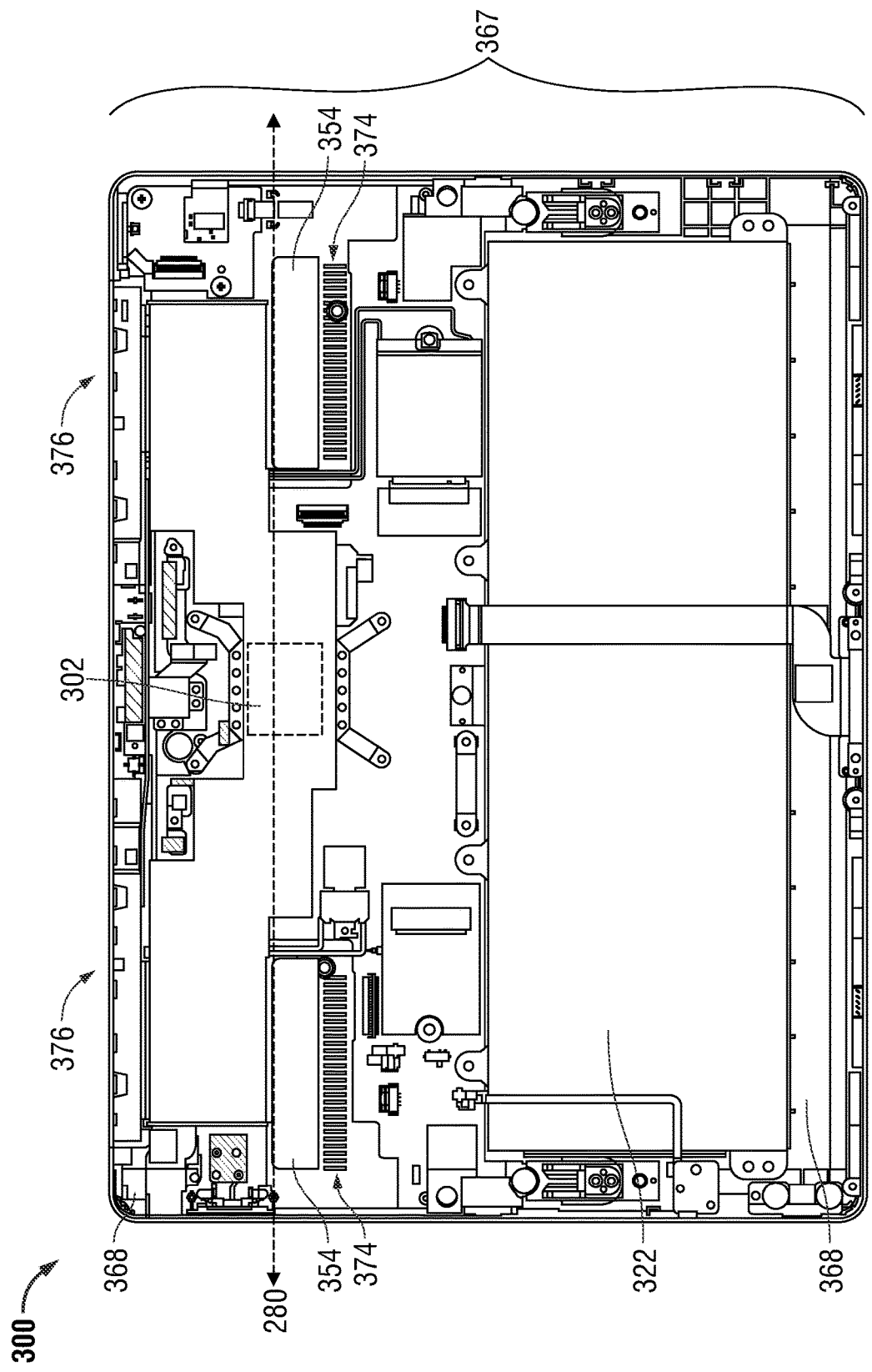
FIG. 3 is a graphic diagram top view if an interior of an information handling system including the ion emitter/collector blower cooling system according to an embodiment of the present disclosure.

FIG. 3 is a graphic diagram top view if an interior of an information handling system 300 including the ion emitter/collector blower cooling system 354 according to an embodiment of the present disclosure. The information handling system 300 shown in FIG. 3 may be similar to the information handling system shown in FIG. 2B with the front cover or display (e.g., FIG. 2B, 270) removed allowing for the hardware components therein to be shown. Again, the orientation of the information handling system chassis 300 shows a tablet-type or two-in-one information handling system 300 in a vertical orientation with a top of the information handling system 300 being closest to the top of the image and the bottom of the information handling system 300 being closest to the bottom of the image.

As described herein, the information handling system 300 may include a wireless or detachable keyboard (not shown) used by the user to provide input to the information handling system 300. In an embodiment, this keyboard may be operatively and mechanically couplable to a side wall of the tablet-type information handling system 300.

As described herein, the tablet-type or two-in-one information handling system 300 may include a display chassis 367 that includes the back cover 368 and front cover/display (not shown). The back cover 368 and front cover/display may be used to house a hardware processor at the processor location 302 as well as one or more ion emitter/collector blower cooling systems that are placed vertically below a CPU centerline 380 in tablet-type information handling system 300 in a vertical, near-vertical, or otherwise upright orientation. Other hardware components such as a battery 322, a memory device (not shown), a PMU (not shown) are also housed within the display chassis 367 of the tablet-type or two-in-one information handling system 300 in a vertical orientation. The front cover/display, as described herein, includes a front cover/display that serves both to cover this hardware as well as an input device such as the touch screen video display device as described herein. The back cover 368 may also house a camera (not shown) or other imaging device used by a user to capture still images or videos.

As described herein, the ion emitter/collector blower cooling system 354 may include one or more air inlet vents 374 formed vertically below each of the ion emitter/collector blower cooling systems 354 in vertically orientated information handling system 300. These air inlet vents 374 may allow air to be drawn into the display chassis 367 via activation of the ion emitter/collector blower cooling systems 354 as well as a result of the air buoyancy differences between the cool air outside of the information handling system 300 and the relatively hotter air within the display chassis 367. Air may be blown out of the display chassis 367 at one or more air exhaust vents 376 located at a vertically upper exhaust vent location to provide a convection-enhanced airflow thereby cooling the air and heat-generating components (e.g., the hardware processor) within the display chassis 367.

As shown in FIG. 3, the ion emitter/collector blower cooling system 354 is at a vertical location below a CPU centerline 380. The CPU centerline 380 is closer, vertically, to the air exhaust vents 376 while the ion emitter/collector blower cooling system locations 354 are located below the CPU centerline 380 since the CPU is typically a substantial heat producing hardware component. Still further, the air inlet vents 374 are placed, vertically, lower than the ion emitter/collector blower cooling system locations 354. The placement of the hardware processor at the processor location 302 above the ion emitter/collector blower cooling systems 354 allows for the operation of the ion emitter/collector blower cooling systems 354 to take advantage of a stack effect or chimney effect and clear air heated around the CPU. The stack effect, in the present specification, pulls air into the housing of the information handling system via the air inlet vents 374 and out of the housing via the air exhaust vents 376 due to the differences in air buoyancy between the air inside the housing of the information handling system 300 and the air outside of the information handling system 300. Because the air within the housing of the information handling system 300 is heated due to the operation of the heat-generating hardware components (e.g., the CPU or other hardware processors), cool air is pulled into the display chassis 367 and accelerated through the housing via operation of the ion emitter/collector blower cooling systems 354 for convection-enhanced airflow. This increases the amount of cold air drawn into and heated air passed out of the housing of the information handling system 300 via convection.

As shown in FIG. 3, the back cover 368 may include a kickstand (not shown) formed thereon. This kickstand may allow the user to prop up the tablet-type information handling system 300 in a vertical or near-vertical orientation on a flat surface or a lap in order to interact with the information handling system 300. The kickstand can be moved to a closed orientation for the user to interact with the information handling system 300 as a hand-held tablet configuration. Still further, in an embodiment where the kickstand has been deployed, the user may operatively couple a detachable keyboard to the bottom edge of the information handling system 300 allowing the user to provide input to the information handling system 300. In such a laptop configuration, the air behind the information handling system 300 may be drawn into the display chassis 367, passed through the ion emitter/collector blower cooling system 354 and out of the air exhaust vent 376 with convection-enhanced airflow.

Figure 4:
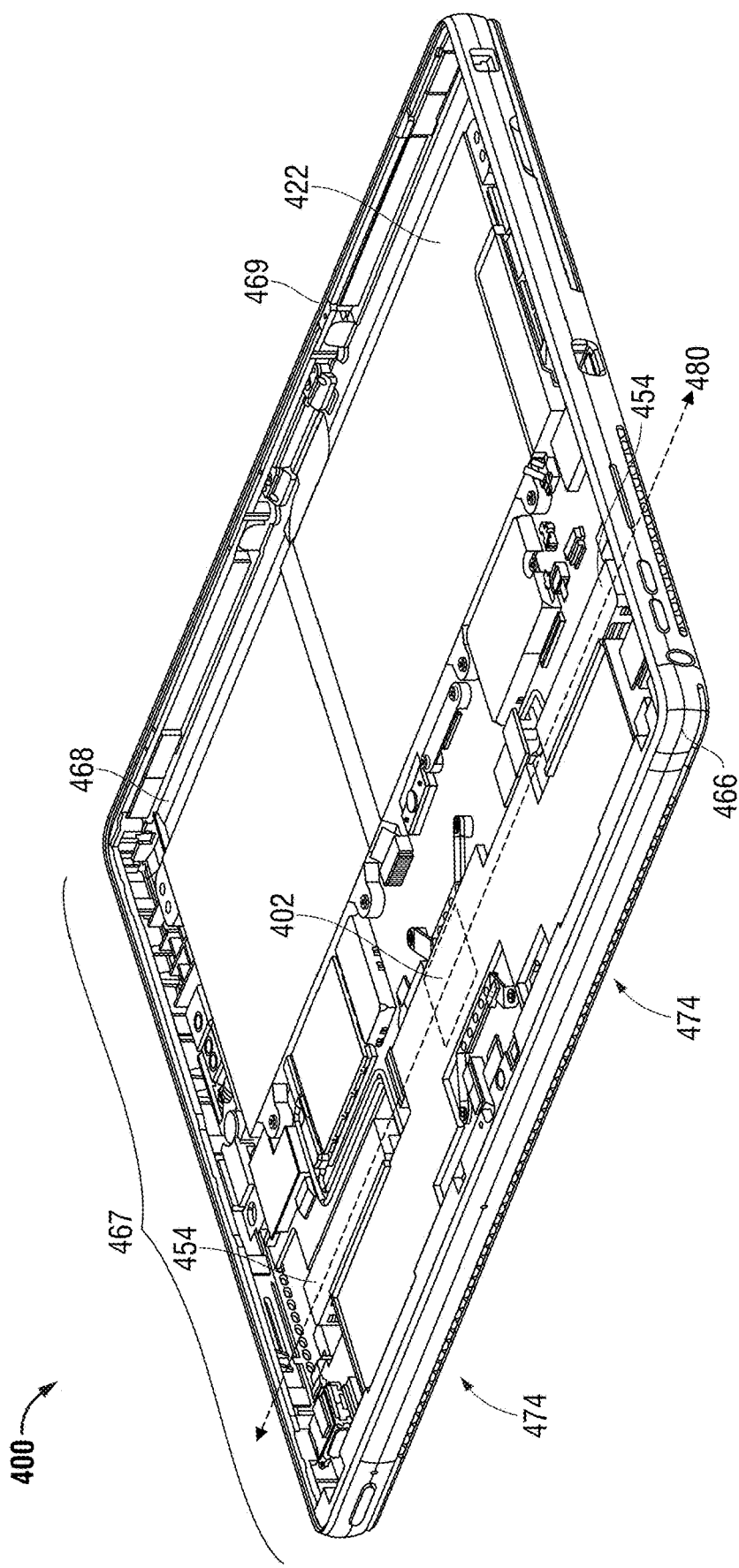
FIG. 4 is a graphic diagram perspective view if an interior of an information handling system including the ion emitter/collector blower cooling system according to an embodiment of the present disclosure.

FIG. 4 is a graphic diagram perspective view of an interior of an information handling system 400 including the ion emitter/collector blower cooling system according to an embodiment of the present disclosure. The information handling system 400 shown in FIG. 4 may be similar to the information handling system shown in FIG. 2B with the front cover/display (e.g., FIG. 2B, 270) removed allowing for the hardware components therein to be shown. The orientation of the information handling system 400 shows a perspective view of the information handling system 400 with the top of the information handling system 400 and the air exhaust vents 474 being shown toward the front edge 466 of the image in FIG. 4.

As described herein, the information handling system 400 may include a wireless or detachable keyboard (not shown) used by the user to provide input to the information handling system 400. In an embodiment, this keyboard may be operatively and mechanically couplable to the bottom of the information handling system 400 shown as the back edge 469 in FIG. 4.

As described herein, the information handling system 400 may include a display chassis 467 that includes the back cover 468 and front cover/display (not shown). The back cover 468 and front cover/display may be used to house a hardware processor at the processor location 402 as well as one or more ion emitter/collector blower cooling systems 454 that are placed vertically at a CPU centerline 480. Other hardware components such as a battery 422, a memory device (not shown), a PMU (not shown) are also housed within the display chassis 467. The front cover/display, as described herein, includes a front cover/display that serves both to cover this hardware as well as an input device via the touch screen video display device as described herein. The back cover 468 may also house a camera (not shown) or other imaging device used by a user to capture still images or videos.

As described herein, the ion emitter/collector blower cooling systems 454 may include one or more air inlet vents (not shown) formed vertically below each of the ion emitter/collector blower cooling systems 454 closer to back edge 469 or the bottom of the tablet-type information handling system 400. These air inlet vents may allow air to be drawn into the display chassis 467 via activation of the ion emitter/collector blower cooling systems 454 as well as a result of the air buoyancy differences between the cool air outside of the information handling system 400 and the relatively hotter air within the display chassis 467 around the CPU centerline 480. Air may be blown out of the display chassis 467 at one or more air exhaust vents 476 at an upper exhaust vent location at the top or front edge 466 of the tablet-type information handling system 400 thereby cooling the air and heat-generating components (e.g., the hardware processor) within the display chassis 467. As shown in FIG. 4, the air exhaust vents 476 are formed along a majority of a top edge of the back cover 468 allowing the airflow created by the ion emitter/collector blower cooling systems 454 to exit along a majority of the surface area of the top edge of the back cover 468 shown as front edge 466.

Again, the placement of the hardware processor at the processor location 402 at the ion emitter/collector blower cooling systems 454 allows for the operation of the ion emitter/collector blower cooling systems 454 to take advantage of a stack effect or chimney effect to clear heated air in that location. The stack effect, in the present specification, pulls air into the housing of the information handling system 400 via the air inlet vents and out of the housing via the air exhaust vents 476 at the upper exhaust vent location due to the differences in air buoyancy between the air inside the housing of the information handling system 400 and the air outside of the information handling system 400. Because the air within the housing of the information handling system 400 is heated due to the operation of the heat-generating hardware components (e.g., the CPU or other hardware processors), cool air is pulled into the display chassis 467 and accelerated through the housing via operation of the ion emitter/collector blower cooling systems 454 with convection-enhanced airflow. This increases the amount of cold air drawn into and heated air passed out of the housing of the information handling system 400 via convection.

Again, the back cover 468 may include a kickstand 478 formed thereon. This kickstand 478 may allow the user to prop up the information handling system 400 on a flat surface or a lap in order to interact with the information handling system 400 in a vertical or near-vertical orientation. The kickstand 478 can be moved to a closed orientation for the user to interact with the information handling system 400 as a hand-held tablet configuration. Still further, in an embodiment where the kickstand 478 has been deployed, the user may operatively couple a detachable keyboard to the bottom edge of the information handling system 400 allowing the user to provide input to the information handling system 400. In such a laptop configuration, the air behind the information handling system 400 may be drawn into the display chassis 467, passed through the ion emitter/collector blower cooling system 454 and out of the air exhaust vent 476.

Figure 5:
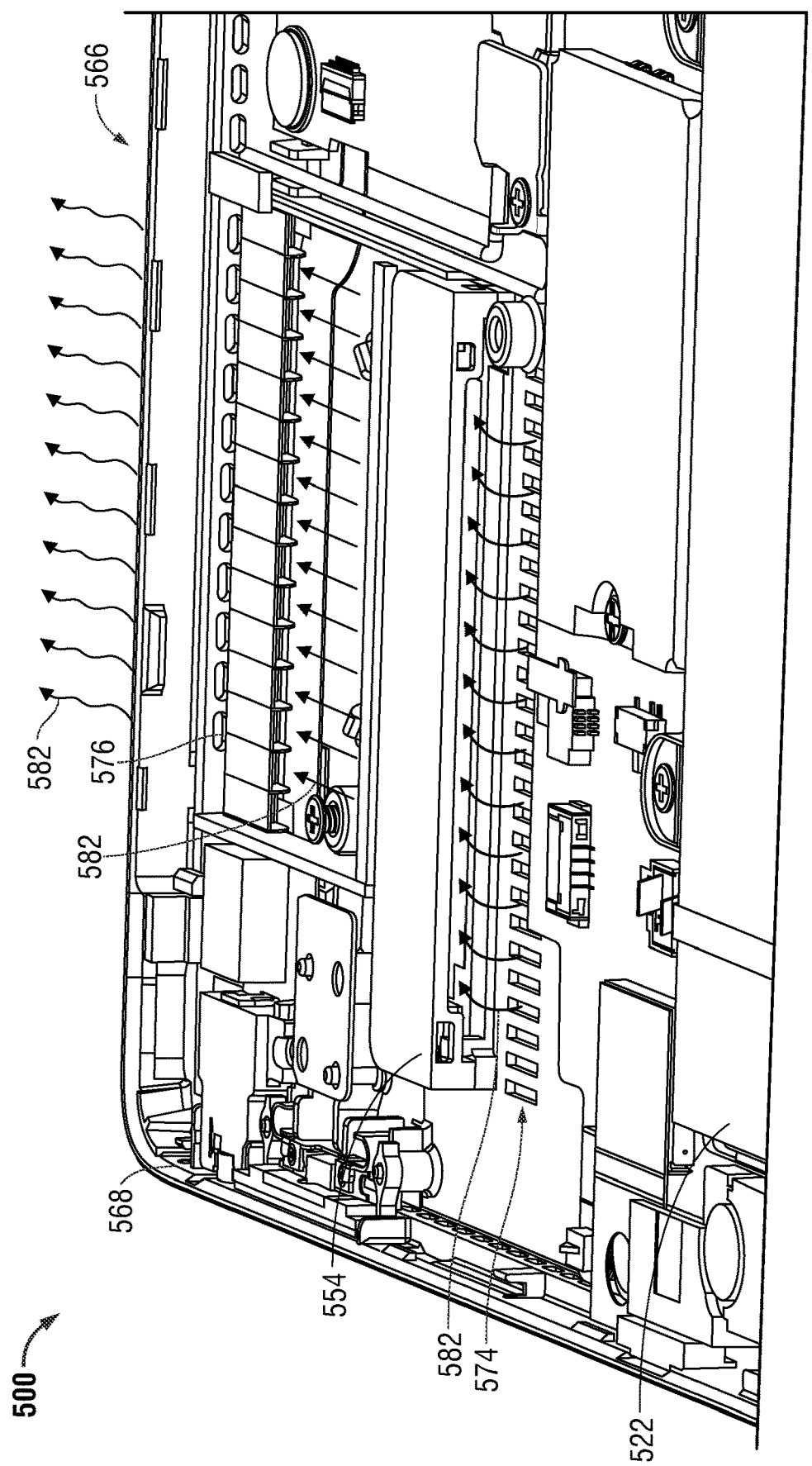
FIG. 5 is a graphic diagram partial perspective view of the ion emitter/collector cooling system with convection-enhanced airflow in an interior of an information handling system chassis including an inlet vent location and an upper exhaust vent location according to another embodiment of the present disclosure.

FIG. 5 is a graphic diagram front view of an interior of an information handling system 500 including the ion emitter/collector blower cooling system 554 according to another embodiment of the present disclosure. The information handling system 500 shows a closer view of an ion emitter/collector blower cooling system 554 relative to an air exhaust vent 576 and air inlet vent 574. It is appreciation that any number of ion emitter/collector blower cooling systems 554 may be incorporated into the housing of the information handling system 500 and the present specification contemplates that more than one ion emitter/collector blower cooling system 554 can be present within the housing.

The back cover 568 and front cover/display (not shown) may be used to house a hardware processor as well as the ion emitter/collector blower cooling system 554 that are placed vertically at or below a CPU centerline as described herein. Other hardware components such as a battery 522, a memory device (not shown), a PMU (not shown) are also housed within the display chassis 567. The front cover/display, as described herein, includes a front cover/display that serves both to cover this hardware as well as an input device via the touch screen video display device as described herein. The back cover 568 may also house a camera (not shown) or other imaging device used by a user to capture still images or videos.

As described herein, the ion emitter/collector blower cooling systems 554 may include one or more air inlet vents 574 formed vertically below each of the ion emitter/collector blower cooling systems 554 in the information handling system 500. These air inlet vents 574 may allow air to be drawn into the display chassis 567 via activation of the ion emitter/collector blower cooling systems 554 as well as a result of the air buoyancy differences between the cool air outside of the information handling system 500 and the relatively hotter air within the display chassis 567. This creates a convection-enhanced airflow 582 between the air inlet vent 374 and the ion emitter/collector blower cooling system 554. Air may be blown out of the display chassis 567 at one or more air exhaust vents 576 at an upper location as described herein thereby cooling the air and heat-generating components (e.g., the hardware processor) within the display chassis 567. As shown in FIG. 5, the air exhaust vents 576 are formed along a majority of a top edge 566 of the back cover 568 allowing the airflow created by the ion emitter/collector blower cooling systems 554 to exit along a majority of the surface area of the top edge 566 of the back cover 568. As shown in FIG. 5, the airflow 582 between the air inlet vent 574 and the ion emitter/collector blower cooling system 554 may increase in velocity as it is passed into the ion emitter/collector blower cooling system 554 and the ions created by the ion emitter of the ion emitter/collector blower cooling system 554 drags that airflow 582 through the ion emitter/collector blower cooling system 554. The airflow 582, upon exiting the ion emitter/collector blower cooling system 554 passes over or at a location where heat from heat-generating hardware components (e.g., a processor) and is drawn out of the air exhaust vents 576 as shown.

Again, the placement of the hardware processor at the processor location above the ion emitter/collector blower cooling systems 554 allows for the operation of the ion emitter/collector blower cooling systems 554 to take advantage of a stack effect or chimney effect. The stack effect, in the present specification, pulls air into the housing of the information handling system 500 via the air inlet vents 574 and out of the display chassis 567 via the air exhaust vents 576 due to the differences in air buoyancy between the air inside the housing of the information handling system 500 and the air outside of the information handling system 500 for convection-enhanced airflow. Because the air within the display chassis 567 of the information handling system 500 is heated due to the operation of the heat-generating hardware components (e.g., the CPU or other hardware processors), cool air is pulled into the display chassis 567 and accelerated through the housing via operation of the ion emitter/collector blower cooling systems 554. This increases the amount of cold air drawn into and heated air passed out of the housing of the information handling system 500 via convection.

Figure 6:
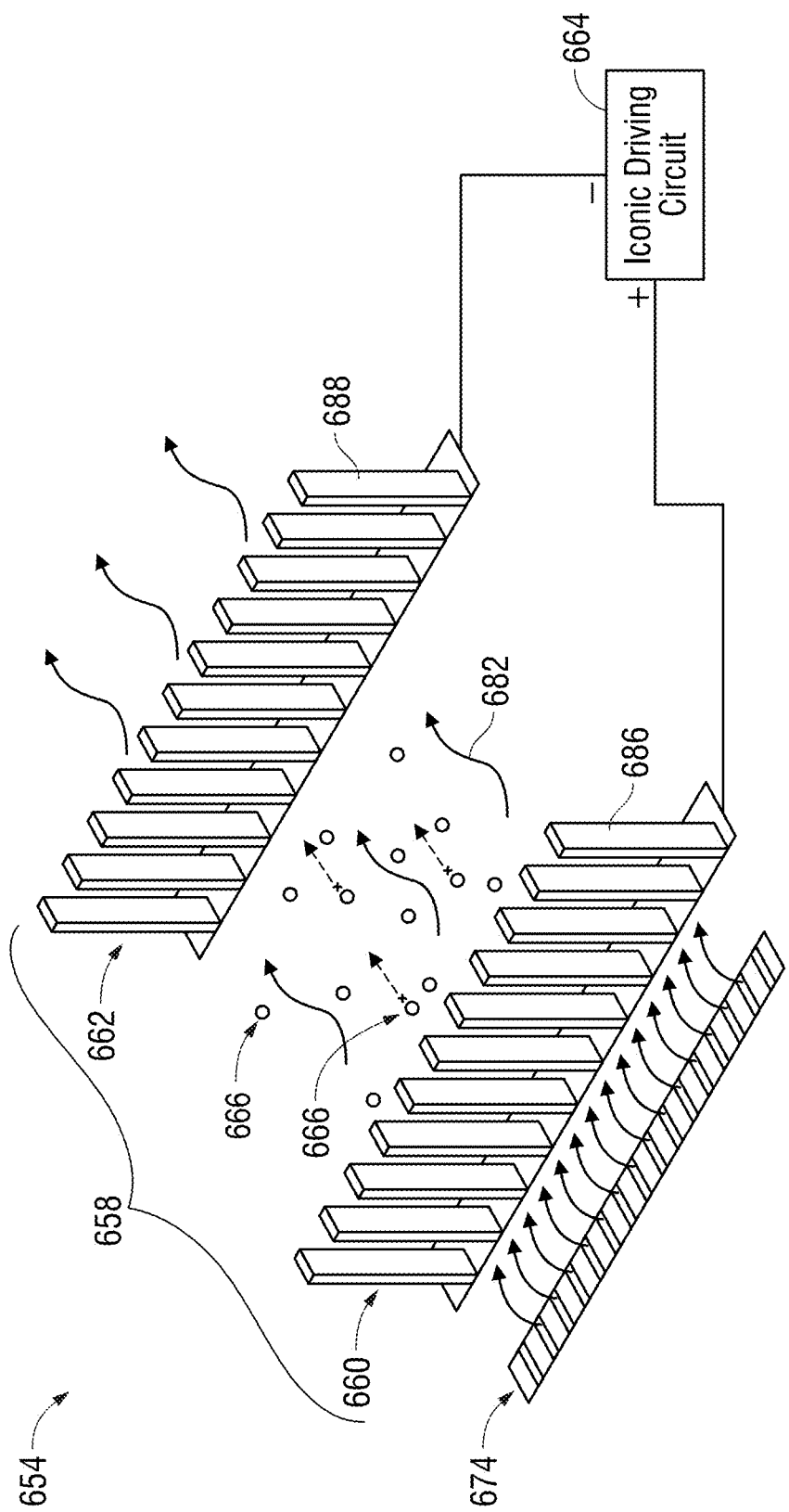
FIG. 6 is a graphic diagram perspective view of an ion emitter/collector blower cooling system including an ion emitter and ion collector according to another embodiment of the present disclosure.

FIG. 6 is a graphic diagram perspective view of an ion emitter/collector blower cooling system 654 including an ion emitter 660 and ion collector 662 according to another embodiment of the present disclosure. The ion emitter/collector blower cooling system 654 may be coupled within a chassis of the information handling system in an embodiment so that heat generated by the operation of the hardware (e.g., hardware processor, memory devices, PMU, CPU, etc.) may be directed out of the information handling system via an air exhaust vent formed in the chassis (e.g., at a top side surface of the base chassis of the information handling system). The ion emitter/collector blower cooling system 654 may include an ion emitter/collector blower housing used to house the components of the ion emitter/collector blower cooling system 654 described herein in an embodiment. In an alternative embodiment, the ion emitter/collector blower cooling system 654 does not include an ion emitter/collector blower housing and instead, those components of the ion emitter/collector blower cooling system 654 are operatively coupled to the chassis of the information handling system.

The ion emitter/collector blower cooling system 654 includes an ion emitter 660. In an embodiment, the ion emitter 660 includes a plurality of emitter blades 686 through which air may pass and which are used to create an airflow into, through, and out of the ion emitter/collector blower housing. The number of emitter blades 686 may vary depending on an anticipated level of heat generation by the hardware components within the information handling system, or the shape and design of the ion emitter/collector blower housing or chassis of the information handling system, among other factors. Each of the emitter blades 686 are coupled to an electrode of a high voltage source of an ionic driving circuit 664. In an embodiment, each of the emitter blades 686 includes a blade edge. In one embodiment, the blade edges may be made to come to a sharp point in order to facilitate the creation of more ions. In an embodiment, the ion emitter 660 of the ion emitter/collector blower system 654 and the emitter blades may be made of a refractory metal such as niobium, chromium, molybdenum, tantalum, tungsten, and rhenium among others. In an embodiment, the portions of the ion emitter/collector blower cooling system 654 and emitter blades 686 may be electroplated with a refractory metal such as niobium, chromium, molybdenum, tantalum, tungsten, and rhenium among others with an interior layer of the ion emitter/collector blower cooling system 654 and emitter blades 686 being made of a conductive material such as iron. It is appreciated that the emitter blades 686 may be made of any alloy of metal that includes alloys of those refractory metals described herein.

The ion emitter/collector blower cooling system 654 also includes an ion collector 662 with a distance 658 between the ion emitter 660 and ion collector 662 across which ions 666 may generate airflow 682. In an embodiment, the ion collector 662 includes a plurality of collector blades 688 through which air may pass and which are used to deionize those ions 666 created at the ion emitter 660 as described herein. The number of collector blades 688 may vary depending on an anticipated level of heat generation by the hardware components within the information handling system, or the shape and design of the ion emitter/collector blower housing or housing of the information handling system, among other factors such as the creation of ions 666 at the ion emitter 660. Each of the collector blades 688 are coupled to an electrode of a high voltage source of an ionic driving circuit 664 in an embodiment. In an embodiment, the collector blades 688 are coupled to a grounding source used to prevent arcing between the ion emitter 660 and ion collector 662. In an embodiment, each of the collector blades 688 includes a blade edge. It is appreciated that the collector blades 688 may be made of any alloy of metal that includes alloys of those refractory metals described herein.

As described herein, the ion emitter 660 and its emitter blades 686 as well as the ion collector 662 and its collector blades 688 are electrically coupled to a high voltage source (e.g., 2 kV to 10 kV voltage source difference between the ion emitter 660 and the ion collector 662). In an embodiment, the ionic driving circuit 664 may include a boost converter that provides, for the high voltage source of the ionic driving circuit 664, those voltages described herein to the ion emitter 660 and ion collector 662. An electric field is created across the distance 658 between the ion emitter 660 and the ion collector 662.

As described in embodiments herein, the ion most of emitter/collector blower cooling system 654 may be operatively coupled to an ionic driving circuit 664. In an embodiment, the ionic driving circuit 664 is controlled via the processor, the PMU with a hardware controller, or both. The ionic driving circuit 664, in an embodiment, includes a high voltage source that is operatively coupled to the ion emitter/collector blower cooling system 654. In an embodiment, the high voltage source may include a boost converter that steps up voltage from its input (e.g., a battery or A/C power adapter) to the output at the ion emitter/collector blower cooling system 654. The high voltage source of the ionic driving circuit 664 causes the ion emitter 660 to emit ions 166 from the blade edges of each emitter blade 686. In the context of the present specification, the term "emit", or "emitter" is meant to describe an action and device that, at its edges or other surfaces, creates ions 666 and, via an electromagnetic repulsion, repels those ions 666 towards an attracting, oppositely charged source such as the ion collector 662 described herein. In an embodiment, the high voltage source of the ionic driving circuit 664 causes electrons to be ripped away from certain molecules such as gas molecules in the atmosphere thereby creating ions (e.g., positively-charged ions) at the edges or other surfaces of the emitter blades 686. This ionization process may include the removal of one or more electrons from the outer valence shells of the individual molecules within the gas such that they become positively charged (e.g., cations) in an embodiment. In an example where the interior of the ion emitter/collector blower housing includes atmospheric air, any number of types of gas molecules may be subjected to this process. For example, where the gas includes oxygen (O), the ionization of oxygen may include the removal of a single electron or two electrons from the oxygen molecule. This may lead to a $O^+$ or $O^{2+}$ ion (e.g., cation) being created by the ion emitter/collector blower cooling system 654 with the ionic driving circuit 664 in an embodiment. Other gas molecules or molecules within the atmosphere within the ion emitter/collector blower housing 156 may similarly be ionized such as nitrogen, carbon dioxide, argon, hydrogen, etc. to create other ions such as $N^{+1}$, $N^{+2}$, $N^{+3}$, $N^{+4}$, $N^{+5}$, $O_3$ (ozone), $H^{+1}$.

This ionization of the atmospheric gases within the ion emitter/collector blower housing helps to cause an airflow 682 within the ion emitter/collector blower housing. In an embodiment, the movement of the ions 666 from the ion emitter 660 to the ion collector 662 creates a shearing force on the air (e.g., ionized molecules 666 drag non-ionized molecules or air molecules 684) within the ion emitter/collector blower housing. This shearing force pulls the other air molecules 684 in the direction of the travel of the ions 666 created by the ion emitter/collector blower cooling system 654 with the electric field across distance 658 towards the ion collector 662 thereby creating this airflow 682. In an embodiment, the movement of the ions 666 (shown as positive ions indicated with a "+" sign) created and emitted from the ion emitter 660 may be from the ion emitter 660 to the ion collector 662. In an example embodiment, the ion emitter 660 may be operatively coupled to a positive electrode of the high voltage source of the ionic driving circuit 664. As a result of generating the positively charged ions 666, the charged ion emitter 660 now repels those positively charged ions 666 causing the charged ions 666 to be repelled away from the ion emitter 660, following the electric field created between the ion emitter 660 and ion collector 662 across distance 658, and attracted to the ion collector 662.

In an embodiment, the ion collector 662 is operatively coupled to a negative or opposite electrode of the high voltage source of the ionic driving circuit 664. In an embodiment, the ion collector 662 is operatively coupled to a grounding source or high voltage negative source of the ionic driving circuit 664. Whether the ion collector 662 is coupled to a negative electrode of the high voltage source or to ground of the high voltage source, the voltage difference between the ion emitter 660 and ion collector 662 and distance 658 determines an electric field between the ion emitter 660 and the ion collector 662. The ions 666 created by the ion emitter 660 follow this electric field. In an embodiment where the ion collector 662 is operatively coupled to a negative electrode of the high voltage source and not ground, the ion collector 662 may be electrically insulated from the remaining portions of the ion emitter/collector blower cooling system 654 including the ion emitter/collector blower housing. In an embodiment, this electrical isolation may be accomplished by making the ion emitter/collector blower housing out of an electrically non-conductive material such as plastic. In an embodiment, the electrical isolation may be accomplished by placing an insulative gasket (not shown) between the ion collector 662 and the ion emitter/collector blower housing and the ion emitter 660. The electrical isolation of the ion collector 662 allows for the electrical field between the ion emitter 660 and ion collector 662 to be formed allowing for an electrical field path for the ions 666 to follow.

In an embodiment, the creation of the electric field between the ion emitter 660 and ion collector 662 causes the positively-charged ions 666 created by the ion emitter 660 to be attracted to the negatively charged ion collector 662 further causing movement of the ions 666 and creating an airflow 682 within the ion emitter/collector blower housing as described. As the positively-charged ions 666 reach the ion collector 662, those missing valence electrons stripped away by the ion emitter 660 at the ions 666 may be added to a valence shell of the ionized molecules placing those gases at a neutral electrical charge again. Following the example of the ionization of the oxygen molecules in the atmospheric gases within the ion emitter/collector blower housing by the ion emitter 660, as these $O^+$ or $O^{2+}$ ions 666 (e.g., cations) have their extraneous electrons returned from at their valence electron shells (e.g., a single electron or two electrons, respectively) the oxygen molecules are placed in an electrically neutral state.

The creation of this airflow 682 via the ionic movement of the ions 666 created by the ion emitter 660 has a low-pressure head of around 0.04 to 0.05 inches of $H_2O$ (water column) as compared to the rotation of a fan or blower that may have a pressure head of around 0.5 inches of H2O. However, the flow rate of air into and out of the ion emitter/collector blower cooling system 654 via operation of the ion emitter 660 and ion collector 162 creating ions 666 is relatively higher than the potential flow rate of air created by the rotation of a fan. For purposes of the present specification, the term "pressure head" is defined as the height of a fluid (e.g., air, water or other fluids) column that corresponds to a particular pressure exerted by the fluid column corresponding to pressure or psi of airflow created by the ionization of air. By imparting relatively high airflow rate with lower pressure head, the acoustics of the ion emitter/collector blower cooling system 654 are reduced in an embodiment. Further, placement of the ion emitter/collector blower cooling system 654 in a chassis of an information handling system with a lower inlet vent and a higher exhaust vent relative to the location of the ion emitter/collector blower cooling system 654, the airflow 682 may be enhanced by convection due to a chimney effect through the information handling system chassis.

In an embodiment, the airflow 682 created by this movement of the ions 666 may supplement the airflow created via the rotation of a fan or activation of a blower. As such, in an embodiment, the rotation of the fan may be reduced in speed or stopped as compared to other fans that do not operate alongside an ion emitter/collector blower cooling system 654 in other information handling systems. Because the movement of the ions 666 creates an airflow, in some embodiments the rotation of the fan may be stopped allowing the cooling of the hardware within the housing of the information handling system by the ion emitter/collector blower cooling system 654 to be accomplished via the airflow created by the creation of the ions 666 by the ion emitter 660. In some embodiments where the heat of the hardware within the housing of the information handling system increases, the hardware processor may direct motor driver hardware to drive a fan motor to turn the fan so that the additional airflow created by the rotation of the fan blades may increase the speed of the airflow further. This allows the noises associated with the rotation of the fan to be reduced or even eliminated during relatively cool temperatures within the housing of the information handling system thereby decreasing the noise heard by the user of the information handling system. As a result, in an embodiment, the ion emitter/collector blower cooling system 654 described herein may have a noiseless base capability of cooling the information handling system with a backup cooling system via actuation of a fan motor to rotate the fan blades as described herein. This may further increase the user satisfaction of the information handling system during operation of the information handling system by decreasing fan noise heard by the user.

It is appreciated that a positive electrode of the high voltage source of the ionic driving circuit 664 may be operatively coupled to the collector structure 662 with the negative electrode of the high voltage source operatively coupled to the emitter structure 660 so the airflow 682 is reversed. In this example embodiment, the ion collector structure 662 of the ion emitter/collector blower cooling system 654 may strip electrons from the gas molecules creating a positively-charged ion 666 (e.g., cation) whereby the ion collector structure 662 operates, even temporarily, as an ion emitter. This allows the airflow created by the shearing force of the created ions 666 to be reversed. In an embodiment, this may be done so that any dust or debris collecting within the ion emitter/collector blower housing, or the chassis of the information handling system may be dislodged. Because the ion emitter 660 is placed vertically above an air inlet vent 674, any dust or debris collected via this reversed airflow may be passed out of the housing of the information handling system via this air inlet vent 674. The ionic driving circuit 664 may, therefore, selectively reverse the operatively connection of the electrodes to the ion emitter 660 and ion collector 662 to change the direction of airflow as described in order to perform this internal cleaning process.

Figure 7:
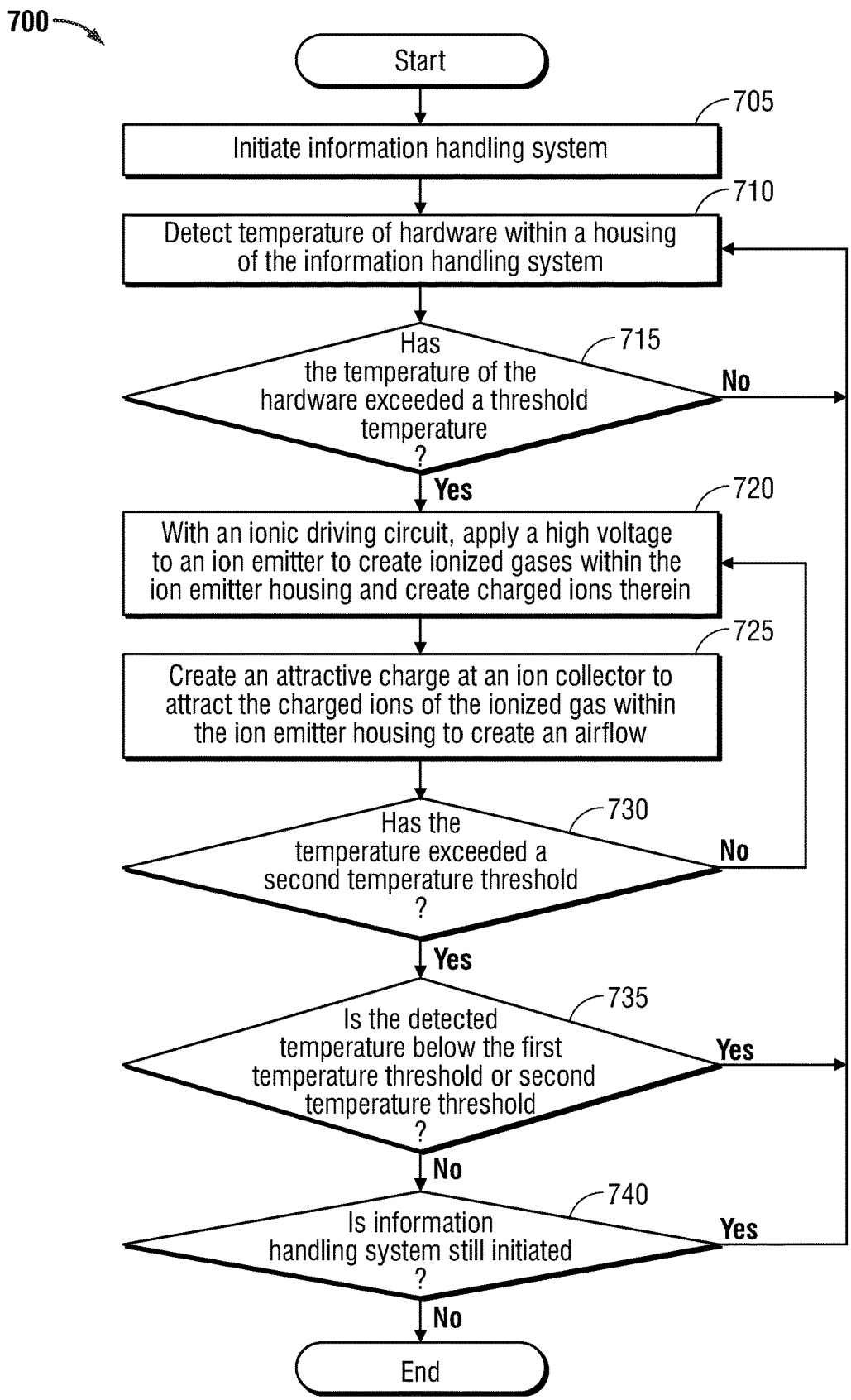
FIG. 7 is a flow diagram of a method of operating an ion emitter/collector blower cooling system of an information handling system according to an embodiment of the present disclosure.

FIG. 7 is a flow diagram of a method 700 of an ion emitter/collector blower cooling system of an information handling system according to an embodiment of the present disclosure. The ion emitter/collector blower cooling system described herein may operate with other cooling systems (either passive or active) placed within a housing of the information handling system such as a fan, blower, heat pipe, a set of thermal fins, and/or a vapor tube, among other types of cooling systems.

The method 700 includes, at block 705 with initiating the information handling system. This initiation process may be conducted by the user actuating, for example, a power key on the information handling system. The actuation of this power key may cause the execution of a native BIOS, a native OS, or other machine-readable code instructions used and executed by the hardware processor of the information handling system to operate the hardware within the information handling system including the ion emitter/collector blower cooling system described herein.

At block 710, the temperature of the hardware within the housing of the information handling system may be detected. In an embodiment, the temperature of the hardware that is detected may be detected using a temperature sensor, such as a thermistor, disposed in the information handling system or coupled to one or more hardware devices such as the hardware processor, PMU controller, or other hardware processing resource, battery, or video display device, for example, of the information handling system among other hardware devices. Other example embodiments may include a processing management system that measures the processing resources consumed by any type of hardware processing device and calculates an interior temperature of the housing of the information handling system.

At block 715, the method 700 may include determining if the temperature of the hardware exceeded a threshold temperature with an ion emitter/collector control system. The activation of the cooling systems within the housing of the information as well as the some or all parts of the ion emitter/collector blower cooling system described herein with the ion emitter/collector control system executed by an embedded controller or other hardware processing resource may depend on whether a threshold temperature has been reached. In another example embodiment, the process of determining if the threshold temperature has been achieved may determine whether to initiate the ion emitter/collector blower cooling system or whether to increase or decrease the speed of the rotation of another cooling system such as a fan or another type of blower while the ion emitter/collector blower cooling system is also creating ions to generate airflow as described herein. Where the threshold temperature has not been reached at block 715, the method 700 may continue to block 710 to continue monitoring to detect the temperature of the hardware within the housing of the information handling system.

Where the temperature of the hardware has exceeded a threshold temperature at block 715, the method 700 continues to block 720. At block 720, a high voltage is applied to the ion emitter to create ionized gases within the ion emitter housing and create those charged ions using an ionic driving circuit described herein. In an example where the interior of the ion emitter/collector blower housing includes atmospheric air, any number of types of gas molecules may be subjected to this process. For example, where the gas includes oxygen (O), the ionization of oxygen may include the removal of a single electron or two electrons to the outermost valence electron shell. This may lead to a $O^+$ or $O^{2+}$ ion (e.g., cations) being created by the ion emitter and ionic driving circuit in an embodiment. Other gas molecules within the atmosphere within the ion emitter/collector blower housing may similarly be ionized.

The temperature threshold described in block 715 may be one of a plurality of temperature thresholds. Where, for example, a first temperature threshold is not reached the ion emitter/collector blower cooling system is not activated while, where the first threshold is reached, the ion emitter/collector blower cooling system is activated. As second temperature threshold, being reached may activate a secondary cooling system, if available, such as a fan or blower. In an embodiment, the first temperature threshold is 40° C.

The activation of the ion emitter/collector blower cooling system at block 720 further includes, at block 725, creating an attractive charge at an ion collector to attract the charged ion of the ionized gas within the ion emitter housing to create the airflow described herein. Again, the ionization of the atmospheric gases within the ion emitter/collector blower housing helps to cause an airflow within the ion emitter/collector blower housing. In an embodiment, the movement of the ions from the ion emitter to the ion collector creates a shearing force on the air (e.g., ionized molecules drag non-ionized molecules) within the ion emitter/collector blower housing. This shearing force pulls the other air molecules in the direction of the magnetic pull of the electric field created between the ion emitter and the ion collector thereby creating this airflow. In an example embodiment, the ion emitter may be operatively coupled to a positive electrode of the high voltage source of the ionic driving circuit. As a result of generating the positively charged ions, the charged ion emitter now repels those positively charged ions causing the charged ions to be repelled away from the ion emitter, following the electric field created between the ion emitter and ion collector, and attracted to the ion collector.

As described herein, the ion emitter/collector blower cooling system may include one or more air inlet vents formed vertically below the ion emitter/collector blower cooling system location. These air inlet vents may allow air to be drawn into the housing of the information handling system such as a display chassis via activation of the ion emitter/collector blower cooling systems as well as a result of the air buoyancy differences between the cool air outside of the information handling system and the relatively hotter air within the display chassis. Air may be blown out of the display chassis at one or more air exhaust vents thereby cooling the air and heat-generating components (e.g., the hardware processor) within the display chassis.

Because the ion emitter/collector blower cooling system is used to cool the heat-generating devices within the housing of the information handling system, placement of the ion emitter/collector blower cooling system relative to, for example, the hardware processor may affect the ability of the ion emitter/collector blower cooling system to cool these devices. For example, the hardware processor, in an example embodiment, may be placed vertically higher than the ion emitter/collector blower housing with its ion emitter and ion collector. The placement of the hardware processor above the ion emitter/collector blower housing allows for the operation of the ion emitter/collector blower cooling system to take advantage of a stack effect or chimney effect. The stack effect, in the present specification, pulls air into the housing of the information handling system via the air inlet vent and out of the housing via an air exhaust vent due to the differences in air buoyancy between the air inside the housing of the information handling system and the air outside of the information handling system. Because the air within the housing of the information handling system is heated due to the operation of the heat-generating hardware components, cool air is pulled into the housing and accelerated through the housing via operation of the ion emitter/collector blower cooling system. This increases the amount of cold air drawn into and heated air passed out of the housing of the information handling system via convection.

In an embodiment, at block 730, the ion emitter/collector blower cooling system may monitor temperature of the information handling system or its hardware components to determine whether a second temperature threshold is detected. This second threshold temperature, as described herein, may be set to a temperature higher than the temperature of the first temperature threshold described in connection with block 715. Where this second temperature threshold (e.g., 45° C.) is reached, a fan or blower may be used to create additional or supplemental airflow through the ion emitter/collector blower housing. Additional temperature thresholds may also be monitored for (e.g., temperatures above those temperatures associated with the first and second temperature thresholds) that cause the voltage to the ion emitter, for example, to be increased in order to create a stronger airflow through the ion emitter/collector blower housing or housing of the information handling system.

It is appreciated, in some embodiments, that the activation of the ion emitter/collector blower cooling system to create charged ions at the ion emitter may be completed when the second temperature threshold is reached while the activation of a fan or other blower is initiated when the first temperature threshold is reached in another embodiment. The selective activation of the ion emitter/collector blower cooling system to create charged ions at the ion emitter at the first temperature threshold and activation of the fan at the second temperature threshold, in an embodiment, allows for a two-stepped or multi-step cooling process. This two-stepped cooling process provides for silent cooling of the hardware within the housing of the information handling system at a first step and, where increased temperatures are detected (e.g., a second temperature threshold), for supplemental cooling of the hardware within the housing of the information handling system. The activation of the fan may cause some noise, but reduced fan rotation may still remain relatively quiet. Additional fan speeds may also be activated at additional steps but may cost additional noise as the fan rotates faster.

At block 735, the ion emitter/collector blower cooling system may determine whether the temperature inside the information handlings system or at one of the components has fallen below a second or first threshold temperature in an embodiment. If so, then flow may return to block 710 to monitor temperature and the method may proceed as before. If not, flow may proceed to block 740.

The method 700 includes determining, at block 740, whether the information handling system is still initiated. Where the information handling system is no longer initiated (e.g., power has been removed from the information handling system via actuation of a power button), the method 600 may end here. Where the information handling system is still initiated, the method 600 may return to block 640 as described herein.

Figure 8:
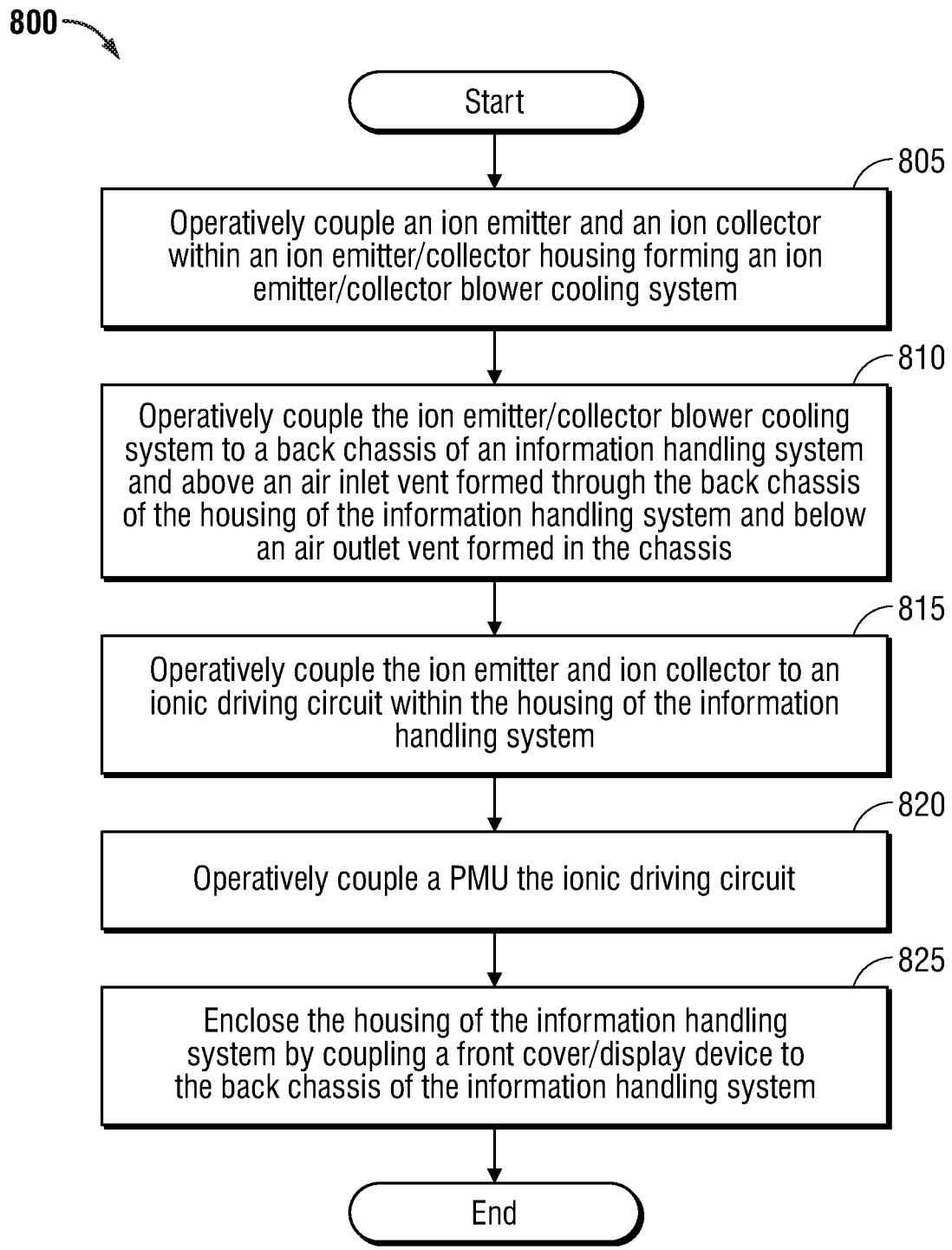
FIG. 8 is a flow diagram of a method of manufacture of an information handling system including an ion emitter/collector blower cooling system according to an embodiment of the present disclosure.

FIG. 8 is a flow diagram of a method 800 of manufacture of an information handling system including an ion emitter/collector blower cooling system with a convection-enhanced airflow according to an embodiment of the present disclosure. The method 800 includes, at block 805, operatively coupling an ion emitter and an ion collector within an ion emitter/collector housing forming an ion emitter/collector blower cooling system. As described herein, the ion emitter includes a plurality of emitter blades through which air may pass and which are used to create an airflow into, through, and out of the ion emitter/collector blower housing. The number of emitter blades may vary depending on an anticipated level of heat generation by the hardware components within the information handling system, or the shape and design of the ion emitter/collector blower housing or chassis of the information handling system, among other factors. Each of the emitter blades are coupled to an electrode of a high voltage source of an ionic driving circuit. In an embodiment, each of the emitter blades includes a blade edge. In one embodiment, the blade edges may be made to come to a sharp point in order to facilitate the creation of more ions. In an embodiment, the ion emitter of the ion emitter/collector blower system and the emitter blades may be made of a refractory metal such as niobium, chromium, molybdenum, tantalum, tungsten, and rhenium among others. In an embodiment, the portions of the ion emitter/collector blower cooling system and emitter blades may be electroplated with a refractory metal such as niobium, chromium, molybdenum, tantalum, tungsten, and rhenium among others with an interior layer of the ion emitter/collector blower cooling system and emitter blades being made of a conductive material such as iron. It is appreciated that the emitter blades may be made of any alloy of metal that includes alloys of those refractory metals described herein.

The ion emitter/collector blower cooling system also includes an ion collector with a distance between the ion emitter and ion collector across which ions may generate airflow. In an embodiment, the ion collector includes a plurality of collector blades through which air may pass and which are used to deionize those ions created at the ion emitter as described herein. The number of collector blades may vary depending on an anticipated level of heat generation by the hardware components within the information handling system, or the shape and design of the ion emitter/collector blower housing or housing of the information handling system, among other factors such as the creation of ions at the ion emitter. Each of the collector blades are coupled to an electrode of a high voltage source of an ionic driving circuit in an embodiment. In an embodiment, the collector blades are coupled to a grounding source used to prevent arcing between the ion emitter and ion collector. In an embodiment, each of the collector blades includes a blade edge. It is appreciated that the collector blades may be made of any alloy of metal that includes alloys of those refractory metals described herein.

The method 800 further includes, at block 810, operatively coupling the ion emitter/collector blower cooling system to a back chassis of an information handling system and above an air inlet vent formed through the back chassis of the housing of the information handling system. The ion emitter/collector blower cooling system may be coupled within a chassis of the information handling system in an embodiment so that heat generated by the operation of the hardware (e.g., hardware processor, memory devices, PMU, CPU, etc.) may be directed out of the information handling system via an air exhaust vent formed in the chassis at an upper exhaust vent location above the ion collector within the chassis of the information handling system. For example, an exhaust vent may be formed at a top side surface of the base chassis of the information handling system when in a vertical, near-vertical, or upright orientation in one embodiment. Further, the ion emitter/collector blower cooling system may be coupled within a chassis of the information handling system at or below the location of a substantial heat producing hardware component such as one or more hardware processors. This location of the ion emitter/collector blower cooling system provides for efficient and quiet convection-enhanced airflow generated by the ion emitter/collector blower cooling system and its location relative to the inlet vent and exhaust vent to clear or remove the heated air nearby the heat producing hardware component efficiently in some embodiments.

The ion emitter and ion collector may be operatively coupled to an ionic driving circuit within the housing of the information handling system at block 815 in the method 800. As descried herein, the ion emitter includes a plurality of emitter blades through which air may pass and which are used to create an airflow into, through, and out of the ion emitter/collector blower housing. The number of blades may vary depending on an anticipated level of heat generation by the hardware components within the information handling system, and the shape and design of the ion emitter/collector blower housing or housing of the information handling system, among other factors. Each of the emitter blades are coupled to an electrode of a high voltage source of an ionic driving circuit. In an embodiment, each of the emitter blades includes a blade edge. In one embodiment, the blade edges may be made to come to a sharp point in order to facilitate the creation of more ions. In an embodiment, the ion emitter and the emitter blades may be made of a refractory metal such as niobium, chromium, molybdenum, tantalum, tungsten, and rhenium among others. In an embodiment, the portions of the ion emitter/collector blower cooling system and emitter blades may be electroplated with a refractory metal such as niobium, chromium, molybdenum, tantalum, tungsten, and rhenium among others with an interior layer of the ion emitter and emitter blades being made of a conductive material such as iron. It is appreciated that the emitter blades may be made of any alloy of metal that includes alloys of those refractory metals described herein.

Additionally, the ion collector includes a plurality of collector blades through which air may pass and which are used to deionize those ions created at the ion emitter as described herein. The number of collector blades may vary depending on an anticipated level of heat generation by the hardware components within the information handling system, and the shape and design of the ion emitter/collector blower housing or the housing of the information handling system, among other factors such as the creation of ions at the ion emitter. Each of the collector blades are coupled to an electrode of a high voltage source of an ionic driving circuit in an embodiment. In an embodiment, the collector blades are coupled to a grounding source used to prevent arcing between the ion emitter and ion collector. In an embodiment, each of the collector blades includes a blade edge. It is appreciated that the ion collector blades may be made of any alloy of metal that includes alloys of those refractory metals described herein.

As described herein, the ion emitter and its blades as well as the ion collector and its blades are electrically coupled to a high voltage source (e.g., 2 kV to 10 kV voltage source difference between the ion emitter and the ion collector). In an embodiment, the ionic driving circuit may include a boost converter that provides, for the high voltage source of the ionic driving circuit, those voltages described herein to the ion emitter and ion collector.

At block 820, a PMU is operatively coupled to the ionic driving circuit. The PMU may provide power to the ionic driving circuit so that the voltages necessary to create ions at the ion emitter can be provided to the ion emitter during operation of the information handling system and the ion emitter/collector blower cooling system.

The method 800 includes, at block 825, enclosing the housing of the information handling system by coupling a front cover/display device to the back chassis of the information handling system. In an embodiment, the front cover/display of the information handling system may be a touch display device that also or alternatively allows the user to provide input to the information handling system. As described herein, the information handling system includes the back cover and front cover/display and may, in an example embodiment, form a tablet-type or two-in-one information handling system. In an embodiment, the back cover and front cover/display may be used to house a processor at the processor location as well as one or more ion emitter/collector blower cooling systems at an ion emitter/collector blower cooling system location. Other hardware components such as a battery, a memory device, and a memory device are also housed within the housing of the tablet-type information handling system. The front cover/display, as described herein, includes a front cover/display that serves both to cover this hardware as well as an input and output device via the touch screen video display device as described herein. At this point, the method 800 may end.

The blocks of the flow diagrams of FIGS. 7 and 8 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
   a hardware processor;
   a memory device;
   a power management unit (PMU) to provide power to the processor and memory device;
   an ion emitter/collector blower cooling system including an ion emitter and an ion collector housed within an ion emitter/collector blower housing, the ion emitter/collector blower system being placed at a location within a chassis of the information handling system vertically lower than the hardware processor in the chassis;
   an ionic driving circuit operatively coupled to the ion emitter via a high voltage to ionize gases within the ion emitter/collector blower housing and create charged ions that generate an airflow along a voltage field to and through an ion collector; and
   an air inlet vent located below the ion emitter/collector blower cooling system and formed in a back surface of the chassis of the information handling system and an air exhaust vent located at an upper exhaust vent location above the ion collector within the chassis of the information handling system so that the airflow is brought into the chassis of the information handling system via the ion emitter/collector cooling system and out of the air exhaust vent where a location of the air inlet vent relative to the upper exhaust vent location of the air exhaust vent in the chassis of the information handling system in a vertical orientation provides convection-enhanced airflow with the ion emitter/collector blower cooling system.

2. The information handling system of claim 1 further comprising:
   the ion collector to provide a deionization source for the ionized gases formed by the ion emitter, the ion collector including one or more separated blades through which the airflow may pass.

3. The information handling system of claim 2, wherein the separated blades of the ion collector operate as thermal fins to dissipate heat conducted from a passive heat conducting device.

4. The information handling system of claim 1 further comprising:
   the ion emitter including a plurality of emitter blades operatively coupled to the ionic driving circuit, the ionic driving circuit including a high-voltage electrical source to strip electrons from gas molecules via the high voltage at edges of the blades of the ion emitter.

5. The information handling system of claim 1 further comprising:
   the air exhaust vent formed into a top side edge of the chassis of the information handling system.

6. The information handling system of claim 1, further comprising:
   a kickstand formed on a lower half of the information handling system, where the kickstand is used to prop up the information handling system in an upright orientation when the kickstand is deployed.

7. The information handling system of claim 1, wherein the convection-enhanced airflow through the chassis of the information handling system by the ion emitter/collector blower system is supplemented using a buoyancy of air heated inside of the chassis of the information handling system toward the upper exhaust vent location in the chassis of the information handling system in a vertical orientation.

8. The information handling system of claim 1 further comprising:
   a passive heat conducting device placed between the ion collector and the air exhaust vent.

9. An ion emitter/collector blower cooling system for an information handling system comprising:
   an ion emitter and an ion collector housed within an ion emitter/collector blower housing, the ion emitter/collector blower system being disposed at a location with a chassis of the information handling system vertically at or lower than a hardware processor; and
   an ionic driving circuit operatively coupled to the ion emitter via a high voltage to ionize gases within the ion emitter/collector blower housing and create charged ions to generate an airflow to and through the ion collector;
   an air inlet vent formed in a back surface of the chassis of the information handling system in a vertical orientation and located below the ion emitter/collector blower cooling system; and
   an air exhaust vent located at an upper exhaust vent location above the ion collector within the chassis of the information handling system so that the airflow is brought into the chassis of the information handling system and out of the air exhaust vent via operation of the ion emitter/collector blower system, where the location of the air inlet vent relative to the upper exhaust vent location in the chassis generates a convection-enhanced airflow.

10. The ion emitter/collector blower cooling system of claim 9 further comprising:
the ion collector formed at an external opening of the ion emitter/collector blower housing to provide a deionization source for the ionized gases formed by the ion emitter, the ion collector including one or more separated blades through which the airflow may pass.

11. The ion emitter/collector blower cooling system of claim 10, wherein the separated blades of the ion collector operate as thermal fins to dissipate heat conducted from a passive heat conducting device.

12. The ion emitter/collector blower cooling system of claim 9 further comprising:
the ion emitter including a plurality of blades operatively coupled to the ionic driving circuit, the ionic driving circuit including a high-voltage electrical source to strip electrons from gas molecules via the high voltage at edges of the blades of the ion emitter.

13. The ion emitter/collector blower cooling system of claim 9 further comprising:
the air exhaust vent formed along a top side edge of the chassis of the information handling system.

14. The ion emitter/collector blower cooling system of claim 9, wherein the convection-enhanced airflow through the base chassis of the information handling system by the ion emitter/collector blower system is supplemented using a buoyancy of heated air inside the chassis of the information handling system with a chimney effect toward the upper exhaust vent location in the chassis of the information handling system.

15. The ion emitter/collector blower cooling system of claim 9 further comprising:
a passive heat conducting device placed between the ion collector and the air exhaust vent.

16. A tablet-type information handling system comprising:
an information handling system housing including a back chassis and a display chassis, the information handling system housing to house:
a hardware processor;
a memory device;
a power management unit (PMU) to provide power to the hardware processor and memory device;
an ion emitter/collector blower cooling system including an ion emitter and an ion collector housed within an ion emitter/collector blower housing, the ion emitter/collector blower system being placed at a location with the information handling system housing of the tablet-type information handling system vertically at or lower than the processor within the information handling system chassis; and
an ionic driving circuit operatively coupled to the ion emitter via a high voltage to ionize gases within the ion emitter/collector blower housing and generate charged ions to create an airflow to and through the ion collector;
wherein the back chassis includes an air inlet vent located in the back chassis below the ion emitter/collector blower system and an air exhaust vent located at an upper exhaust vent location above the ion collector so that air can be brought into the information handling system housing of the tablet-type information handling system and out of the air exhaust vent via operation of the ion emitter/collector blower cooling system to provide convection-enhanced airflow.

17. The tablet-type information handling system of claim 16:
the ion collector formed at the external opening of the ion emitter/collector blower housing to provide a deionization source for the ionized gases formed by the ion emitter, the ion collector including one or more separated blades through which the airflow may pass.

18. The tablet-type information handling system of claim 16:
the ion emitter including a plurality of blades operatively coupled to the ionic driving circuit, the ionic driving circuit including a high-voltage electrical source to strip electrons from gas molecules via the high voltage at edges of the blades of the ion emitter.

19. The tablet-type information handling system of claim 16, wherein the convection-enhanced airflow through the information handling system housing of the tablet-type information handling system by the ion emitter/collector blower cooling system is supplemented using a difference between a buoyancy of air heated inside the housing of the information handling system toward the upper exhaust vent location in the housing of the tablet-type information handling system.

20. The tablet-type information handling system of claim 16:
a passive heat conducting device placed between the ion collector and the air exhaust vent.

* * * * *